United States Patent [19]

Harvey

[11] Patent Number: 5,734,285

[45] Date of Patent: Mar. 31, 1998

[54] ELECTRONIC CIRCUIT UTILIZING RESONANCE TECHNIQUE TO DRIVE CLOCK INPUTS OF FUNCTION CIRCUITRY FOR SAVING POWER

[76] Inventor: Geoffrey P. Harvey, 104 Ainsworth Street, Cambridge CB1 2PD, England

[21] Appl. No.: 698,464

[22] PCT Filed: Dec. 17, 1993

[86] PCT No.: PCT/GB93/02594

§ 371 Date: Nov. 3, 1994

§ 102(e) Date: Nov. 3, 1994

[87] PCT Pub. No.: WO94/15394

PCT Pub. Date: Jul. 7, 1994

Related U.S. Application Data

[63] Continuation of Ser. No. 331,601, filed as PCT/GB93/02594, Dec. 17, 1993 published as WO94/15394, Jul. 7, 1994, abandoned.

[30] Foreign Application Priority Data

| Dec. 19, 1992 | [GB] | United Kingdom | 9226522 |
| Mar. 3, 1993 | [GB] | United Kingdom | 9304248 |
| Jul. 8, 1993 | [GB] | United Kingdom | 9314166 |

[51] Int. Cl.$^6$ ............................................. G06F 1/04

[52] U.S. Cl. .......................................... 327/291; 327/304

[58] Field of Search .................................. 327/2, 5, 113, 327/291, 306, 304; 331/17, 55, 117 R, 167

[56] References Cited

U.S. PATENT DOCUMENTS

| 3,593,167 | 7/1971 | Koulopoulos | 328/155 |
| 4,654,605 | 3/1987 | Lehmann et al. | 331/55 |
| 4,902,914 | 2/1990 | Masuoka | 307/446 |
| 4,922,210 | 5/1990 | Flachenecker et al. | 331/167 |
| 5,036,294 | 7/1991 | McCaslin | 331/17 |
| 5,041,802 | 8/1991 | Wei et al. | 331/116 |
| 5,057,705 | 10/1991 | Uchikoshi | 331/17 |
| 5,283,502 | 2/1994 | Piasvowski et al. | 315/244 |
| 5,325,060 | 6/1994 | Mansfield et al. | 324/322 |
| 5,343,169 | 8/1994 | Debaty | 331/17 |

FOREIGN PATENT DOCUMENTS

| 395 146 A1 | 10/1990 | European Pat. Off. |
| 513 717 A1 | 11/1992 | European Pat. Off. |
| WO 93/04528 | 3/1993 | WIPO |

OTHER PUBLICATIONS

Wyatt, "Reactive CCD drive saves power," *EDN*, 19 Jan. 1989, pp. 206, 208, 210, and 211.

Athas et al., "An Energy-Efficient CMOS Line Driver Using Adiabatic Switching," Technical Report ACMOS-TR-2, Info. Sci. Inst., 30 Jul./2 Nov. 1993, pp. 1–16.

Seitz et al., "Hot-Clock nMOS," *Procs. 1985 Chapel Hill Conf. on VLSI*, 1985, pp. 1–16.

Suaya et al., *VSLI and Parallel Computation* (Morgan Kaufmann Publishers, San Mateo, CA), Chap. I, Seitz "Concurrent Architectures," 1990, pp. 1–11.

(List continued on next page.)

*Primary Examiner*—Timothy P. Callahan
*Assistant Examiner*—Jeffrey Zweizig
*Attorney, Agent, or Firm*—Skjerven, Morrill, MacPherson, Franklin & Friel; Ronald J. Meetin

[57] ABSTRACT

An electronic circuit uses a resonance technique to reduce power consumption. The circuit contains function circuitry (14) that performs electronic functions. Certain elements (14F) of the function circuitry change state at a circuit frequency in response to one or more input signals, typically clock signals (CKR and $\overline{\text{CKR}}$), that change state at the circuit frequency. A resonant system (50 or 140), which oscillates at the circuit frequency, is operated close to a resonant frequency so that the resonant system is largely in resonance. Oscillations of the resonance system typically include frequency components attributable to the fundamental resonance frequency and at least one other resonance frequency of the system. The resonant system is coupled to the function circuitry in order to help the indicated elements in changing state by overcoming parasitic capacitances and/or inductances associated with the function circuitry.

85 Claims, 15 Drawing Sheets

OTHER PUBLICATIONS

Chi, "Designing Salphasic Clock Distribution Systems," *Res. on Integ. Sys.–Procs. 1993 Symp.*, 1993, pp. 219–233.

Younis, "Practical Implementation of Charge Recovering Asymptotically Zero Power CMOS," *Res. on Integ. Sys.–Procs. 1993 Symp.*, 1993, pp. 234–250.

Parry, "Asynchronous attraction is timeless and saves power," *New Electronics*, Feb. 1993, pp. 14–16.

Bogart, *Electric Circuits* (MacMillan Pub. Co., New York), 1988, pp. 682–683.

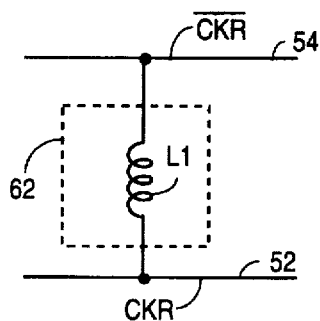
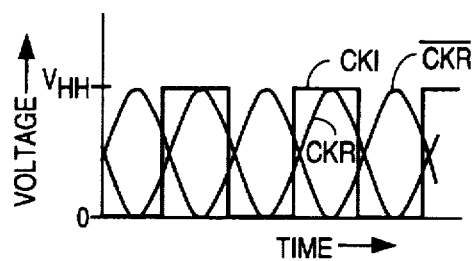
FIG. 5    FIG. 6
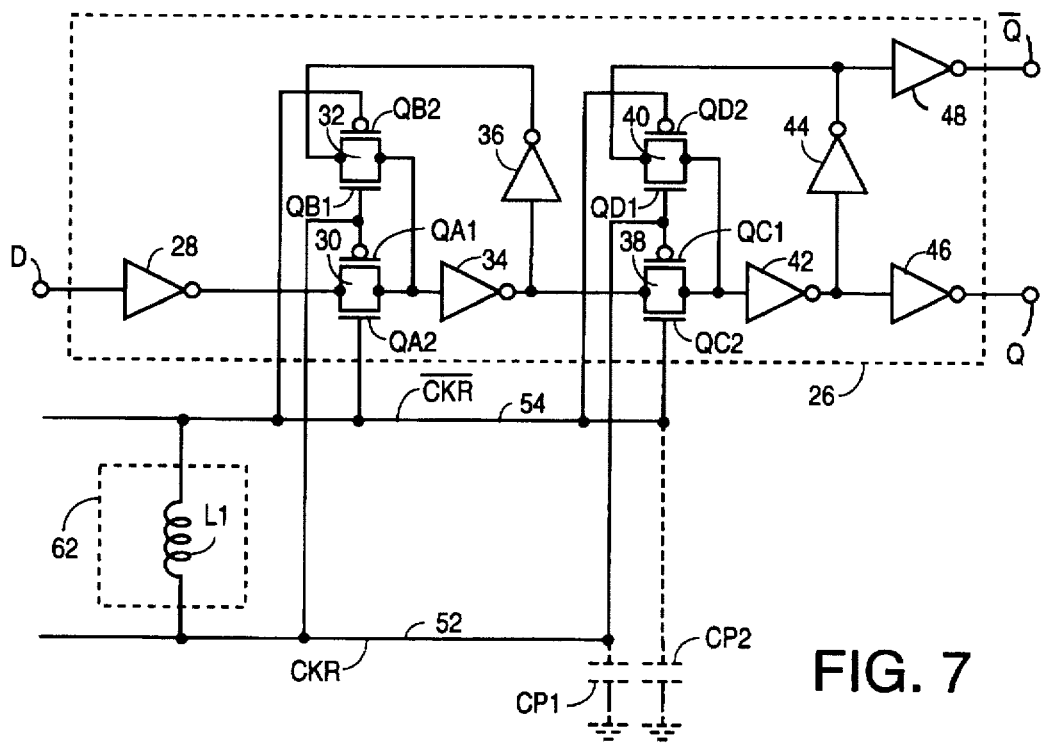
FIG. 7
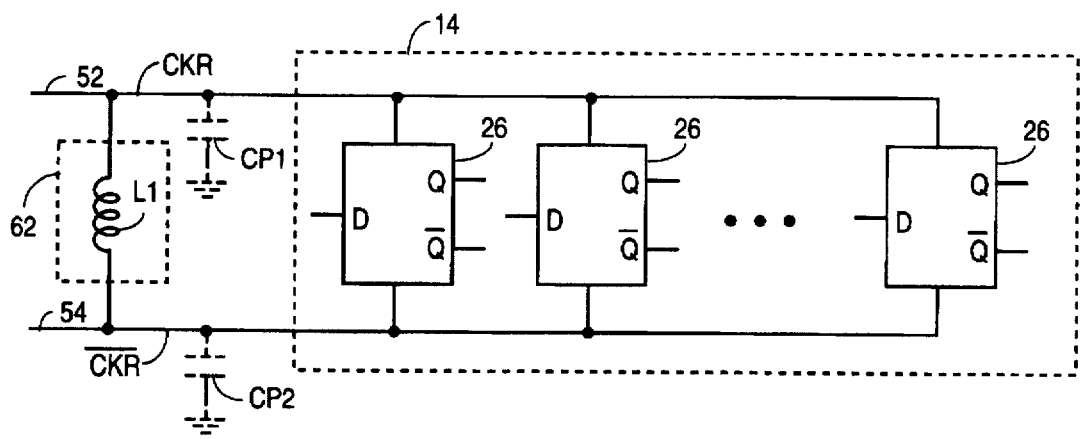
FIG. 8

ELECTRONIC CIRCUIT UTILIZING RESONANCE TECHNIQUE TO DRIVE CLOCK INPUTS OF FUNCTION CIRCUITRY FOR SAVING POWER

CROSS REFERENCE TO RELATED APPLICATIONS

This is a continuation of U.S. patent application Ser. No. 08/331,601, filed 3 Nov. 1994, now abandoned which corresponds to International PCT Application PCT/GB93/02594, published as WO94/15394, Jul. 7, 1994.

FIELD OF THE INVENTION

This invention relates to electronic circuits. More specifically, this invention relates to the reduction of power consumption in electronic circuits.

BACKGROUND ART

An electronic circuit consumes power in various ways. In particular, power is consumed when input signals to elements of the circuit change state. This power consumption occurs as a result of the charging and discharging of parasitic capacitances associated with the inputs to the circuit elements. Power is not dissipated in the parasitic capacitances themselves but, instead, in the output resistances of earlier circuit elements that furnish the input signals. In modern synchronous integrated circuits ("ICs"), a large portion of the power consumption occurs in clock drivers that provide clock signals to the functional circuit elements.

Referring to the drawings, FIG. 1 illustrates a conventional synchronous CMOS IC useful in understanding clock-driver power consumption. The circuit in FIG. 1 contains a clock driver 10 that furnishes a circuit clock signal CKD on a circuit clock line 12 in response to an input clock signal CKI. Clock driver 10 consists of a group of CMOS inverters 10D connected in parallel. Each inverter 10D is formed with a pair of complementary insulated-gate field-effect transistors ("FETs") QN and QP connected in series between circuit ground and a source of a high supply voltage $V_{HH}$.

Clock signal CKD is provided by way of a clock net to the clock inputs of function elements 14F in function circuitry 14. The clock net consists of the lines that branch out from clock line 12 and go to function elements 14F. A parasitic capacitance is associated with the clock input section of each element 14F. The lines that form the clock net also have their own parasitic capacitances.

Function elements 14F are built in proximity to, or contain components connected to, at least one low-impedance source of fixed reference voltage, typically earth or circuit ground potential. The lines that form the clock net are similarly situated in proximity to at least one low-impedance source of fixed reference voltage. To a good approximation, the parasitic capacitances of the clock net lines and the clock inputs to elements 14F can be represented by a single capacitor CP1 connected between clock line 12 and the ground-potential source.

Typically, (a) the clock input resistance of each function element 14F is very high, (b) the propagation delay from driver 10 to the most remote of elements 14F is small compared to clock-frequency period, and (c) the clock-net lines have low resistance and inductance. To a reasonable approximation, the load that clock CKD presents to driver 10 can likewise be represented by capacitor CP1 since it is also connected between the output of driver 10 and the ground-potential source.

Input clock signal CKI switches between a low voltage level, typically ground reference, and a high voltage level, typically $V_{HH}$, at an input clock frequency $f_{CKI}$. During a full clock cycle in which input clock CKI goes from one level to the other level and then back to the first, driver 10 expends an energy equal to $C_{P1}V_{HH}^2$, where $C_{P1}$ is the value of parasitic capacitance CP1. Half of this energy is dissipated as heat by the QP channel resistances when current flows from the $V_{HH}$ supply through FETs QP to charge capacitance CP1 during one half of the clock cycle. The remaining half of energy $C_{P1}V_{HH}^2$ is dissipated as heat by the QN channel resistances when current flows through FETs QN to discharge capacitance CP1 during the other half of the clock cycle.

The number of functional elements 14F in some modern synchronous ICs is very high. As a consequence, parasitic capacitance CP1 is very high. Driver 10 must be quite large in order to charge and discharge capacitance CP1 at the high switching speed typically required. The net result is that driver 10 dissipates a large portion of the power utilized by the IC. For example, the clock driver in the Alpha RISC processor made by Digital Equipment Corporation reportedly consumes about half of the processor power. This is highly disadvantageous.

The IC of FIG. 1 employs only a single circuit clock signal. However, high clock-driver power dissipation also occurs in synchronous prior art ICs that utilize complementary clock signals. FIG. 2 illustrates part of such a complementary-clock circuit.

The circuit of FIG. 2 contains a clock driver 16 formed with inverters 18 and 20 that provide complementary circuit clock signals CKD and $\overline{CKD}$ on circuit clock lines 22 and 24 in response to input clock CKI. Clocks CKD and $\overline{CKD}$ are furnished to a D-type CMOS master-slave flip-flop 26 consisting of a data input buffer, a master portion, a slave portion, and an output buffer. The input buffer, in turn, consists of a CMOS inverter 28 that inverts data signal D and supplies the inverted D signal to the master portion formed with transmission gates 30 and 32 and CMOS inverters 34 and 36. The slave portion consists of transmission gates 38 and 40 and CMOS inverters 42 and 44 that drive the output buffer formed with CMOS inverters 46 and 48. Each transmission gate 30, 32, 38, or 40 consists of a pair of complementary insulated-gate FETs connected in parallel.

Transmission gates 30, 32, 38, and 40 constitute the clock inputs for flip-flop 26. The parasitic capacitances associated with FETs QA1, QB1, QC1, and QD1 of the transmission-gate clock inputs are represented by equivalent parasitic capacitance CP1 associated with line 22. Similarly, the parasitic capacitances associated with FETs QA2, QB2, QC2, and QD2 of the transmission-gate clock inputs are represented by equivalent parasitic capacitance CP2 associated with line 24.

The circuit in FIG. 2 operates as follows. Assume that input clock CKI is initially low so that circuit clock CKD is low and circuit clock $\overline{CKD}$ is high. Gate 30 is conductive, allowing data D to be loaded into the master portion of flip-flop 26. Gate 32 is non-conductive. When input clock CKI goes high so that circuit clocks CKD and $\overline{CKD}$ change state, gate 30 turns off. Gate 32 turns on to latch data D into the master portion. At the same time, gate 38 turns on to allow data D to enter the slave portion. Gate 40 turns off. When input clock CKI returns to its low level, circuit clocks CKD and $\overline{CKD}$ switch back. Gate 38 turns off. Gate 40 turns on to latch data D into the slave portion. Complementary output signals Q and $\bar{Q}$ are then respectively provided at the true and inverted values of data D.

Letting $V_{HH}$ represent the high supply voltage, it turns out that driver 16 dissipates an energy equal to $(C_{P1}+C_{P2})V_{HH}^2$ in one clock cycle, where CP1 and CP2 are the respective values of parasitic capacitances CP1 and CP2. Consequently, the circuit of FIG. 2 has high clock-driver power dissipation.

High power consumption in the clock-drivers of large state-of-the-art synchronous ICs is a major impediment to future synchronous IC design. It would be extremely desirable to have a mechanism for operating an IC in a synchronous manner without incurring this power penalty.

GENERAL DISCLOSURE OF THE INVENTION

The present invention furnishes a resonance technique for driving clock inputs of circuit elements in an electronic circuit that is at least partially synchronous. The parasitic capacitances associated with the clock inputs of the circuit elements and with the lines of the attendant clock net become part of a resonance mechanism. When the parasitic capacitances are discharged, a large part of the energy in the capacitances is transferred to another part of the resonance mechanism for temporary storage rather than being dissipated as heat. The stored energy is subsequently reused. Consequently, the power consumption of an electronic circuit designed according to the invention is much less than that in an otherwise comparable prior art circuit that utilizes a conventional clock driver.

More particularly, an electronic circuit in accordance with the invention contains a resonant system and function circuitry. In response to an input clock signal at an input clock frequency, the resonant system oscillates at a circuit clock frequency substantially proportional to the input clock frequency to generate a circuit clock signal at the circuit clock frequency. The resonant system is operated close to a fundamental resonance frequency so that the resonant system is largely in resonance. The function circuitry performs electronic functions in synchronism with the circuit clock signal.

In a single-clock implementation, the resonant system typically contains a resonator and a resonance capacitor coupled in series between (a) a circuit clock line on which the circuit clock signal is transmitted and (b) a source of a substantially fixed reference voltage or other voltage at a much lower frequency that the circuit clock frequency. When the parasitic capacitances associated with the clock net and with the clock inputs of elements in the function circuitry are discharged during a half clock cycle, much of the energy in these parasitic capacitances is temporarily transferred to the resonance capacitor. During the next half clock cycle, the energy stored in the resonance capacitor is used to recharge the parasitic capacitances associated with the clock net and clock inputs of the function circuitry.

Alternatively, the resonant system in a single-clock implementation can be formed with a resonator coupled between the circuit clock line and a source of a reference voltage approximately equal to the time-averaged voltage of the circuit clock signal. In this case, the energy in the parasitic capacitances is largely returned to the reference-voltage source.

The invention is readily extended to a complementary-clock implementation in which the resonant system generates a second circuit clock signal substantially inverse to the first circuit clock signal. At least part of the electronic functions of the function circuitry are also performed in synchronism with the second circuit clock signal.

In the complementary-clock implementation, the resonant system typically contains a resonator coupled between a pair of circuit clock lines on which the circuit clock signals are respectively transmitted. When the parasitic capacitances associated with the clock inputs driven from one of the circuit clock signals are discharged during a half clock cycle, much of the energy in these parasitic capacitances is transferred through the resonator to charge the parasitic capacitances associated with the clock inputs driven from the other circuit clock signal. The opposite occurs during the next half clock cycle.

The resonator in both implementations typically contains a main inductive device formed with an inductor or a group of inductors coupled to one another in series. When the resonator is implemented solely with such an inductive device, the fundamental resonance frequency is approximately equal to $\frac{1}{2}\pi\sqrt{L_E C_T}$ where $L_E$ is the inductance of the main inductive device, and $C_T$ is the series equivalent capacitance of all capacitors (both parasitic and real) in parallel with the main inductive device. The waveform of each circuit clock then approximates a sinusoid—i.e., a sine or cosine wave.

The resonator is commonly provided with additional elements so that each circuit clock waveform contains components attributable to one or more resonance frequencies beside the fundamental frequency. For example, the resonator may also contain (a) one or more inductive-capacitive arrangements coupled in parallel with part or all of the main inductive device or/and (b) one or more capacitors coupled to internal points of the main inductive device. As a result, the waveform for each circuit clock can approach various non-sinusoid shapes such as the square-wave shape desirable for the clock inputs of edge-triggered flip-flops and other level-sensitive elements.

The resonant system preferably includes control circuitry for adjusting the resonance frequency. This typically involves changing inductance and/or capacitance values. Also, the resonant system normally includes a driver that provides a small amount of energy to compensate for energy dissipated as heat due to non-idealities in certain parts of the circuit.

By reusing the energy stored in the parasitic capacitances associated with the clock net and clock inputs of the function circuitry, the power needed for these items is small compared to the power dissipated as heat in the transistors of a conventional clock driver. In particular, the invention reduces clock power consumption at least 50% and often much more. When the present circuit is implemented in IC form, the invention commonly reduces chip area because the resonant system occupies less space than a conventional large clock driver.

While the principles of the invention are particularly applicable to circuit clocking, these principles apply to other situations in which there are repetitive signals. More generally, the invention covers an electronic circuit containing function circuitry which performs electronic functions where specified elements of the function circuitry change state at a circuit frequency in response to one or more input signals. The circuit includes a resonant system which oscillates at the circuit frequency. The resonant system is operated close to a fundamental resonance frequency so that the resonant system is largely in resonance. The resonant system is coupled to the function circuitry to assist the specified elements in changing state by overcoming parasitic capacitances and/or parasitic inductances associated with the function circuitry.

BRIEF DESCRIPTION OF THE DRAWINGS

FIG. 5 is a circuit diagram of a resonator employable in the implementations of FIGS. 4, 22–24, 26, 32, 34–37, and 39.

FIG. 6 is a simplified graph of waveforms that arise when the resonator of FIG. 5 is utilized in the complementary-clock implementation of FIG. 4.

FIGS. 7 and 8 are partial circuit diagrams of embodiments in which the resonator of FIG. 5 is utilized in the complementary-clock implementation of FIG. 4.

Like reference symbols are employed in the drawings and in the description of the preferred embodiments to represent the same or very similar item or items.

Figure 1:
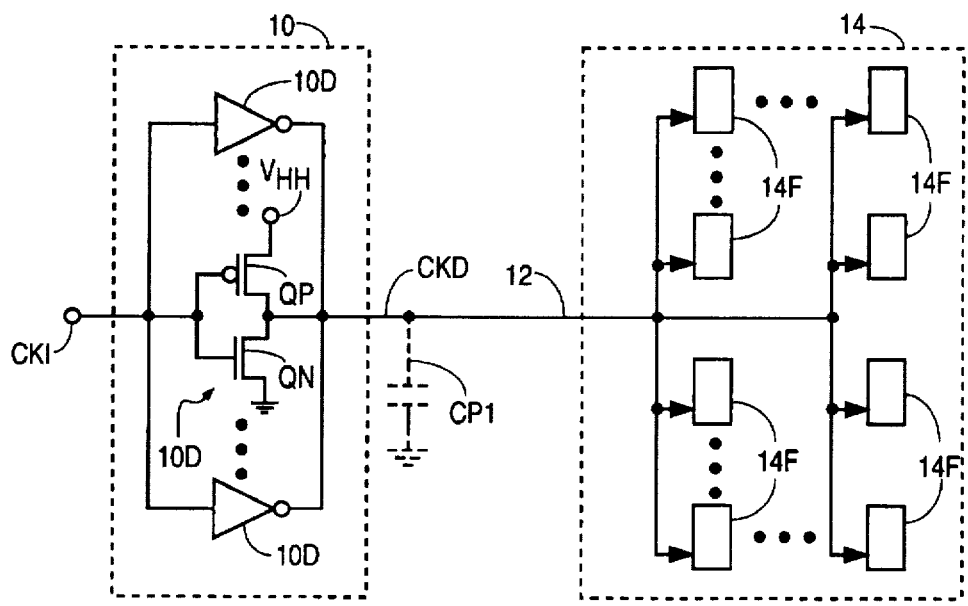
FIGS. 1 and 2 are circuit diagrams of synchronous prior art electronic circuits that employ clock drivers.

All transistors shown in the drawings are enhancement-mode insulated-gate FETs. Bubbles are placed on the gates of P-channel FETs to distinguish them from N-channel FETs.

DESCRIPTION OF THE PREFERRED EMBODIMENTS

Figure 3:
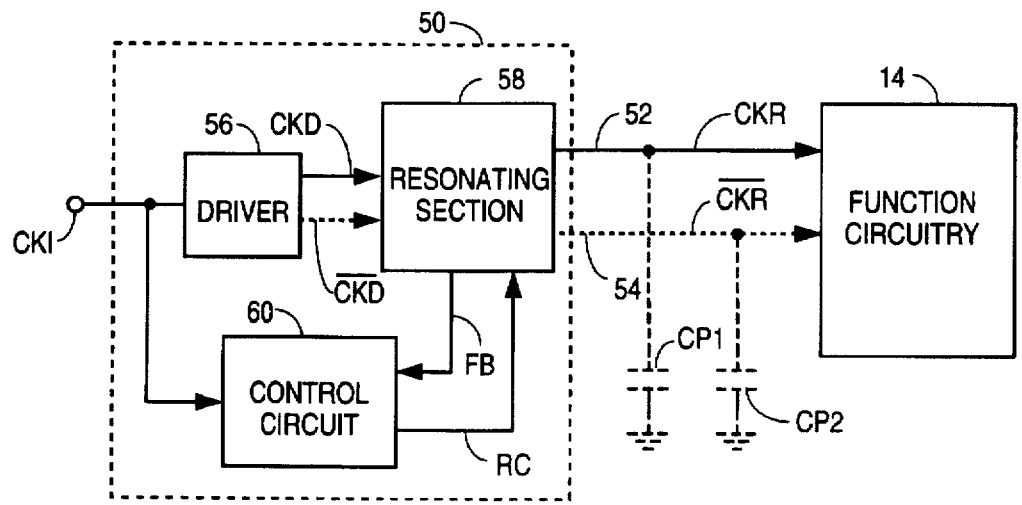
FIG. 3 is a general block diagram of a synchronous electronic circuit that utilizes a resonant system in accordance with the invention.

Referring to FIG. 3, it illustrates a general configuration for a synchronous electronic circuit that contains a resonant system 50 for supplying one or more clock signals to function circuitry 14 at low power consumption in accordance with the teachings of the invention. Resonant system 50 oscillates at a circuit clock frequency $f_{CKR}$ in response to input (or reference) clock signal CKI which switches between its low and high values at input clock frequency $f_{CKI}$. Circuit clock frequency $f_{CKR}$ substantially equals $f_{CKI}$.

Resonant system 50 provides a circuit clock signal CKR at circuit clock frequency $f_{CKR}$ to function circuitry 14 along a circuit clock line 52. Circuit clock CKR is largely in phase with, or largely of opposite phase to, input clock CKI. In complementary-clock implementations, system 50 supplies a further circuit clock signal $\overline{CKR}$ at frequency $f_{CKR}$ to circuitry 14 along a circuit clock line 54. Circuit clock signal $\overline{CKR}$ is of substantially opposite phase to circuit clock signal CKR.

Parasitic capacitance CP1 associated with clock line 52 represents the equivalent sum of (a) the parasitic capacitances associated with the clock inputs of the function elements that receive circuit clock CKR in function circuitry 14 and (b) the parasitic capacitances of the clock-net lines that transmit clock CKR in circuitry 14. To a reasonable approximation, capacitance CP1 thereby represents the capacitive load presented by clock CKR to resonant system 50.

When resonant system 50 also generates circuit clock $\overline{CKR}$, parasitic capacitance CP2 associated with clock line 54 represents the equivalent sum of (a) the parasitic capacitances associated with the clock inputs of the function elements that receive circuit clock $\overline{CKR}$ in circuitry 14 and (b) the parasitic capacitances of clock-net lines that transmit clock $\overline{CKR}$ in circuitry 14. Capacitance CP1 then reasonably represents the capacitive load presented by clock $\overline{CKR}$ to system 50. The values $C_{P1}$ and $C_{P2}$ of capacitances CP1 and CP2 are usually very close to each other.

Resonant system 50 consists of a small driver 56, a resonating section 58, and a control circuit 60. Driver 56 amplifies input clock CKI to drive a driver clock signal CKD at input clock frequency $f_{CKI}$. Driver 56 may also drive a driver clock signal $\overline{CKD}$ substantially inverse in phase to driver clock CKD. Resonating section 58 produces circuit clock CKR and, when present, circuit clock $\overline{CKR}$. For purposes of pictorial illustration, FIG. 3 indicates that section 58 operates in response to driver clock CKD and, when present, driver clock $\overline{CKD}$.

Control circuit 60 controls the operation of resonant system 50 in response to input clock CKI and one or more feedback signals FB supplied from resonating section 58. For this purpose, control 60 may supply one or more resonator control signals RC to section 58. Depending on how components 58 and 60 are implemented, two or more of signals CKD, CKR, FB, and RC may be the same signal. Likewise, two or more of signals $\overline{CKD}$, $\overline{CKR}$, FB, and RC may be the same signal. Control 60 may furnish one or more additional control signals (not shown) to driver 56.

Resonant system 50 operates generally in the following manner. Circuit clock CKR switches between substantially fixed low and high voltage levels at circuit frequency $f_{CKR}$. Assume that clock CKR is at its high level so that parasitic capacitance CP1 is fully charged. When input clock CKI changes in such a way as to cause circuit clock CKR to be driven low, parasitic capacitance CP1 largely discharges along line 52 into resonating section 58. Instead of letting all the capacitive discharge energy be dissipated as heat, section 58 transfers part, usually considerably more than half, of the capacitive discharge energy to a temporary storage site. When clock CKR returns to its high level, section 58 recovers the capacitive energy stored at the temporary site and supplies that energy along line 52 to recharge capacitance CP1.

In a single-clock implementation of system 50, the temporary storage site is typically a capacitor. In a complementary-clock implementation, the temporary storage site is normally parasitic capacitance CP2. The charging and discharging of capacitance CP2 then occurs in a manner complementary to that of parasitic capacitance CP1.

In being driven by driver 56 at input clock frequency $f_{CKI}$, resonating section 58 oscillates in sympathy with input clock CKI so that circuit clock frequency $f_{CKR}$ substantially equals $f_{CKI}$ at steady-state. Section 58 and, consequently, resonant system 50 have a fundamental resonance frequency $f_R$ at which the system oscillations as represented by circuit clock CKR and, when present, circuit clock $\overline{CKR}$ locally reach maximum voltage amplitude as a function of input clock frequency $f_{CKI}$. System 50 is then in resonance.

Control circuit 60 adjusts the value of fundamental resonance frequency $f_R$ in order to make it very close to $f_{CKI}$. Resonant system 50 then goes substantially into resonance. The result is that (a) the voltage amplitudes of circuit clock CKR and, when present, circuit clock $\overline{CKR}$ reach local maxima, (b) the phase angle between circuit clock CKR and input clock CKI is approximately 0° or 180, and (c) the power consumed by driver 56 is minimized.

To ease the demands on control circuit 60, the values of the elements used to implement components 56–60 are chosen so that the nominal uncontrolled value $f_{RN}$ of resonance frequency $f_R$ is relatively close to input clock frequency $f_{CKI}$. Typically, $f_{RN}$ is slightly more than $f_{CKI}$. Although manufacturing variations may cause the actual uncontrolled value of frequency $f_R$ to differ significantly from $f_{RN}$, components 56 and 58 are implemented in a manner that still enables $f_R$ to be made close to $f_{CKR}$ and $f_{CKI}$. Accordingly, system 50 operates largely in resonance.

A small amount of energy is needed to initiate and sustain the resonant oscillations of resonating section 58. Driver 56 provides this energy. In addition, driver 56 provides energy to compensate for non-idealities such as the small clock-line resistance and the limited quality factors of the components in resonating section 58.

More particularly, resonance frequency $f_R$ depends (among other things) on the values of parasitic capacitance CP1 and, when present, parasitic capacitance CP2. Consider the case where circuit clock CKR is intended to be in phase with input clock CKI. If $f_R$ differs from $f_{CKI}$, a phase difference exists between clocks CKR and CKI (even though $f_{CKR}$ and $f_{CKI}$ are substantially the same). The sign and magnitude of this phase difference is monotonically related to the sign and magnitude of the frequency difference between $f_R$ and $f_{CKI}$.

Control circuit 60 normally senses the phase difference between clocks CKR and CKI. Control 60 may also sense how close the phase difference between clocks $\overline{CKR}$ and CKI is to 180°. Depending on the magnitude(s) and sign(s) of the phase difference(s), control 60 typically adjusts resonance frequency $f_R$ by appropriately adding/subtracting inductance and/or capacitance to bring $f_R$ close to $f_{CKR}$ and thus close to $f_{CKI}$.

Figure 4:
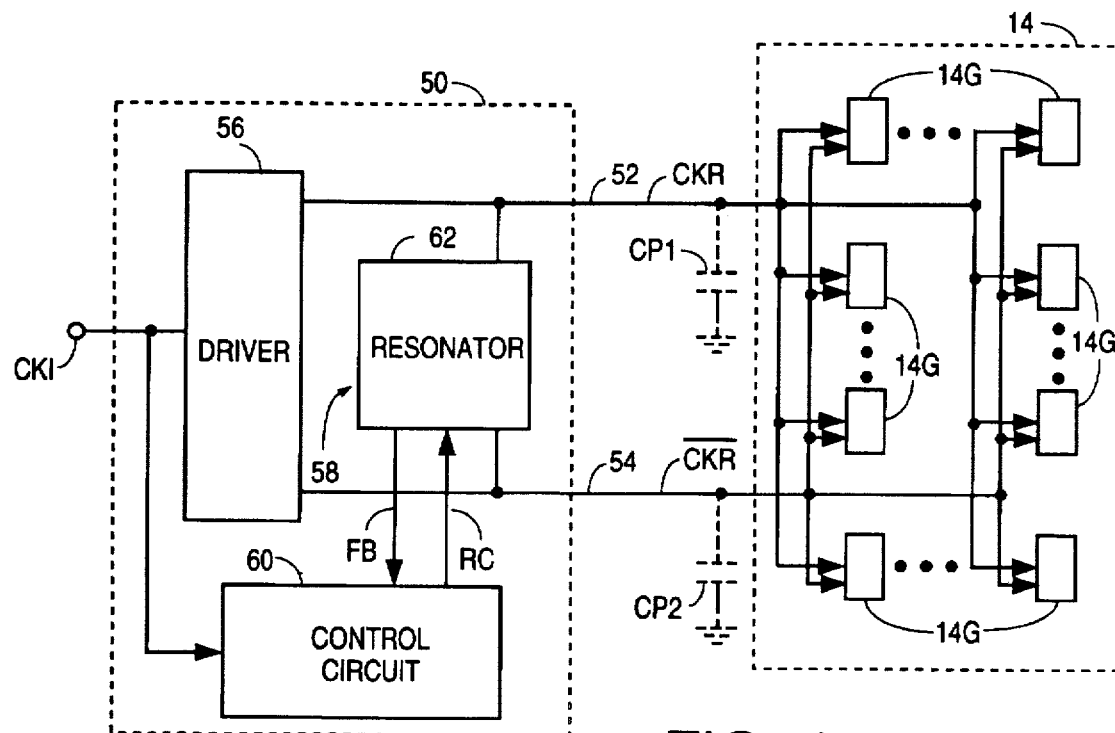
FIG. 4 is a circuit diagram of a complementary-clock implementation of the synchronous circuit in FIG. 3.

FIG. 4 depicts a complementary-clock implementation of the synchronous circuit in FIG. 3. Resonating section 58 of FIG. 3 is implemented in FIG. 4 with a passive resonator 62 connected between clock lines 52 and 54. The lines carrying signals FB and RC, which can be the same signal, may connect to internal points of resonator 62 or to line 52 and/or line 54.

Function circuitry 14 in FIG. 4 consists of a group of function elements 14G having clock inputs connected through a clock net to lines 52 and 54. Each element 14G is illustrated as being responsive to both of circuit clocks CKR and $\overline{CKR}$. However, some of elements 14G could be responsive to only one of clocks CKR and $\overline{CKR}$.

When parasitic capacitance CP1 discharges as clock CKR goes from high to low during a half clock cycle, the CP1 charge largely flows along line 52, through resonator 62, and then along line 54 to charge parasitic capacitance CP2 as clock $\overline{CKR}$ simultaneously goes from low to high. The reverse occurs during the next half clock cycle in which clock CKR goes from low to high while clock $\overline{CKR}$ simultaneously goes from high to low. In this way, the capacitive charge alternately switches between capacitances CP1 and CP2 to keep power consumption low.

Resonator 62 in the complementary-clock implementation of FIG. 4 can be embodied simply with a main inductor L1 as shown in FIG. 5. In this case, resonance frequency $f_R$ approximately equals ½ $\pi\sqrt{L_1 C_T}$ where $L_1$ is the value of inductor L1, and $C_T$ is the series equivalent capacitance of all parasitic and real capacitances in parallel with inductor L1. When resonator 62 consists solely of an inductor, the waveforms for clocks CKR and $\overline{CKR}$ are generally sinusoidal in shape. FIG. 6 illustrates a simplified example of the CKR and $\overline{CKR}$ waveforms when resonator 62 is an inductor, and the waveform for input clock CKI is substantially a square wave.

FIG. 7 depicts a partial embodiment of FIG. 4 for the case where resonator 62 is formed with inductor L1, and one of function elements 14G in circuitry 14 consists of flip-flop 26 described above in connection with FIG. 2. Instead of receiving driver clock signals CKD and $\overline{CKD}$ as in FIG. 2, the clock inputs of transmission gates 30, 32, 38, and 40 are connected to clock lines 52 and 54 to receive clocks CKR and $\overline{CKR}$ in FIG. 7. Aside from this difference, flip-flop 26 operates in the manner described above in connection with FIG. 2. FIG. 8 illustrates how the partial circuit of FIG. 7 is extended to include a group of flip-flops such as flip-flop 26.

Figure 9:
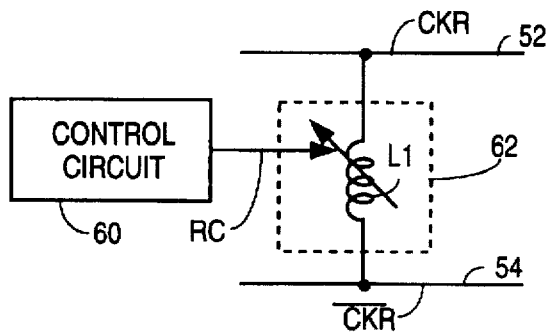
FIGS. 9 and 10 are circuit diagrams of resonators employable in employable in the implementations of FIGS. 4, 22–24, 26, 32, 34–37, and 39.

Inductor L1 in resonator 62 can be a variable (or adjustable) inductor whose inductance is controlled to adjust resonance frequency $f_R$. FIG. 9 illustrates a partial embodiment of FIG. 4 where inductor L1 is a variable inductor controlled by one signal RC from control circuit 60.

Manufacturing variations normally cause corresponding variations in the voltage switching thresholds of (otherwise identical) edge-triggered flip-flops and other level-sensitive switching devices. Since the time-domain waveforms for signals that cause the clock inputs of switching devices to change state invariably differ from the ideal square-wave shape, the difference in switching thresholds affects the synchronism of a circuit containing the switching devices. A square waveform for a signal that changes state at a given frequency consists of a weighted summation of the sinusoidal waveforms of the odd-numbered harmonics (or multiples) of the given frequency—i.e., the first harmonic (which is the given frequency), the third harmonic, the fifth harmonic, and so on.

The synchronism of the circuit in FIG. 4 is improved by adding a parallel combination of one or more inductive-capacitive ("LC") pairs to resonator 62. Each LC pair consists of an inductor and a capacitor connected in series with each other (and in parallel with inductor L1). Each LC pair enables an additional sinusoidal component to be included in the waveforms of clocks CKR and $\overline{CKR}$. The LC values of each LC pair are preferably chosen in such a way that the odd-numbered harmonics above the first harmonic of fundamental resonance frequency $f_R$ are incorporated into the CKR and $\overline{CKR}$ waveforms when $f_R$ equals $f_{CKI}$. The CKR and $_{CKR}$ waveforms thereby start to approximate square time-domain shapes.

The third harmonic is the most important harmonic (beyond the first) for creating a square waveform. Moving to FIG. 10, it illustrates an example in which an LC pair consisting of an inductor L2 and a capacitor C2 is incorporated into resonator 62 in parallel with inductor L1. The values of components L2 and C2 are chosen to produce the third harmonic of $f_R$ when it equals $f_{CKI}$.

Figure 10:
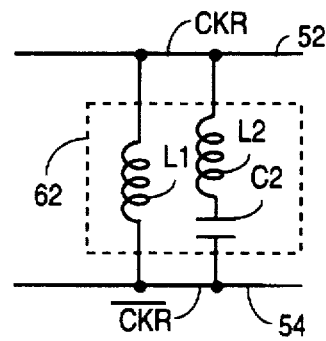
Figure 11:
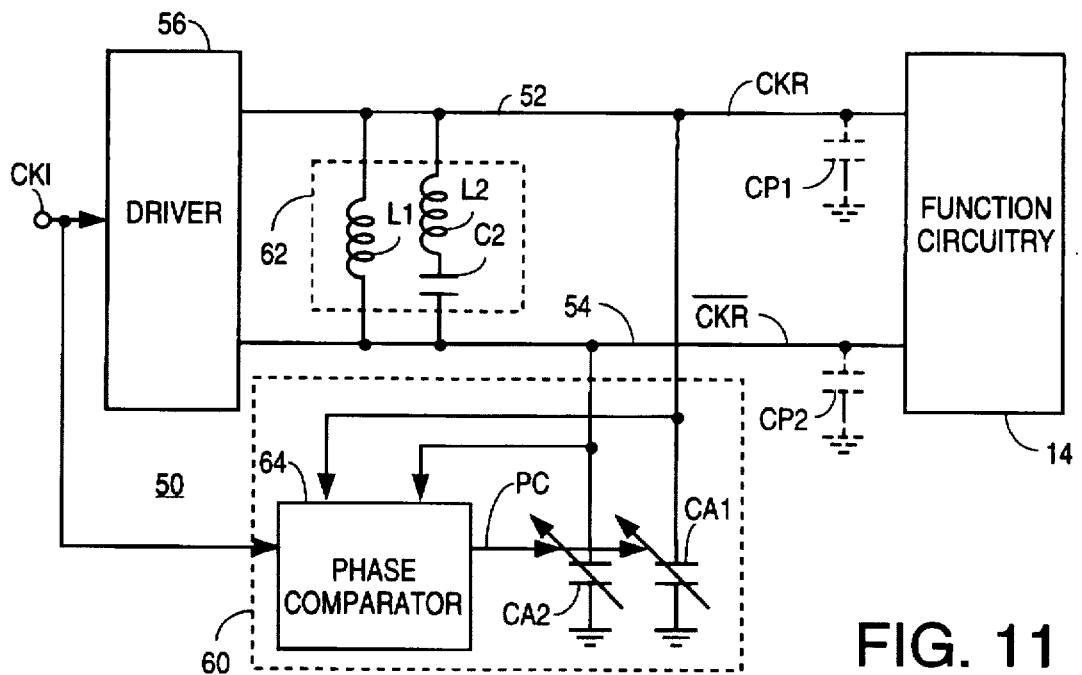
FIG. 11 is a circuit diagram of an embodiment in which the resonator of FIG. 10 is utilized in the complementary-clock implementation of FIG. 4.

FIG. 11 depicts an embodiment of FIG. 4 where resonator 62 is implemented as in FIG. 10, and control circuit 60 utilizes a phase comparison technique for adjusting resonance frequency $f_R$. Control 60 in FIG. 11 consists of a phase comparator 64 and a pair of variable capacitors CA1 and CA2. Phase comparator 64 compares the phases of circuit clocks CKR and $\overline{CKR}$ with the phase of input clock CKI. Depending on the phase differences, comparator 64 generates one or more signals PC that adjust the values of variable capacitors CA1 and CA2. Inasmuch as capacitors CA1 and CA2 are respectively in parallel with parasitic capacitances CP1 and CP2 and thus respectively increase the capacitances of clock lines 52 and 54, the nominal values of capacitances CP1 and CP2 are normally less than the values which would cause nominal value $f_{RN}$ to equal $f_{CKI}$.

Figure 12:
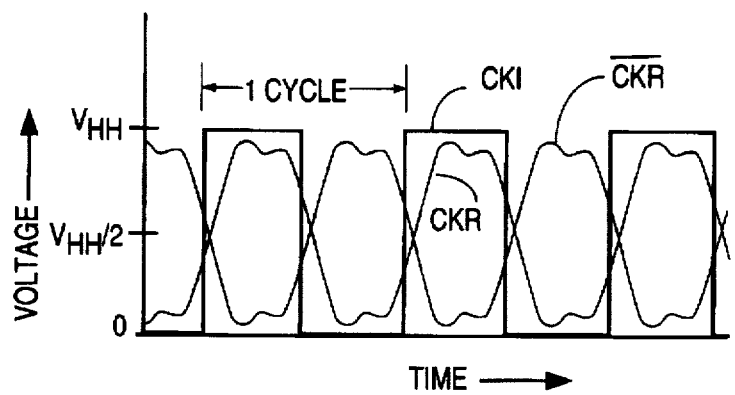
FIG. 12 is a simplified graph of waveforms that arise when the resonator of FIG. 10 is utilized in the complementary-clock implementation of FIG. 4.

FIG. 12 illustrates a simplified example for the CKR and $\overline{CKR}$ waveforms of FIG. 11 when the input CKI waveform is a square wave. The CKR and $\overline{CKR}$ waveforms in FIG. 12 include the third $f_R$ harmonic when $f_R$ equals $f_{CKI}$. As FIG. 12 shows, the CKR and $\overline{CKR}$ waveforms are now reasonable approximations of square waves.

Figure 13:
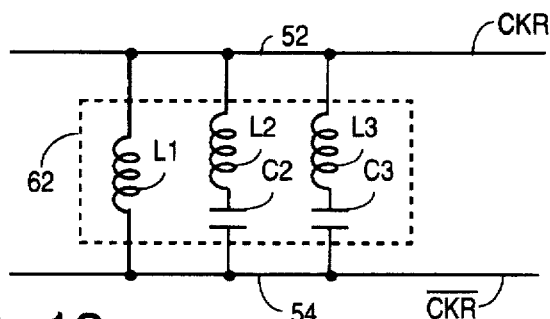
FIG. 13 is a circuit diagram of a resonator employable in the implementations of FIGS. 4, 22–24, 26, 32, 34–37, and 39.

FIG. 13 illustrates an extension of resonator 62 in FIG. 10 in which a further LC combination consisting of an inductor L3 and a capacitor C3 is connected in parallel with inductor L1. The values of elements L3 and C3 are chosen so as to add the fifth $f_R$ harmonic to the CKR and $\overline{CKR}$ waveforms when $f_R$ equals $f_{CKI}$.

Figure 14:
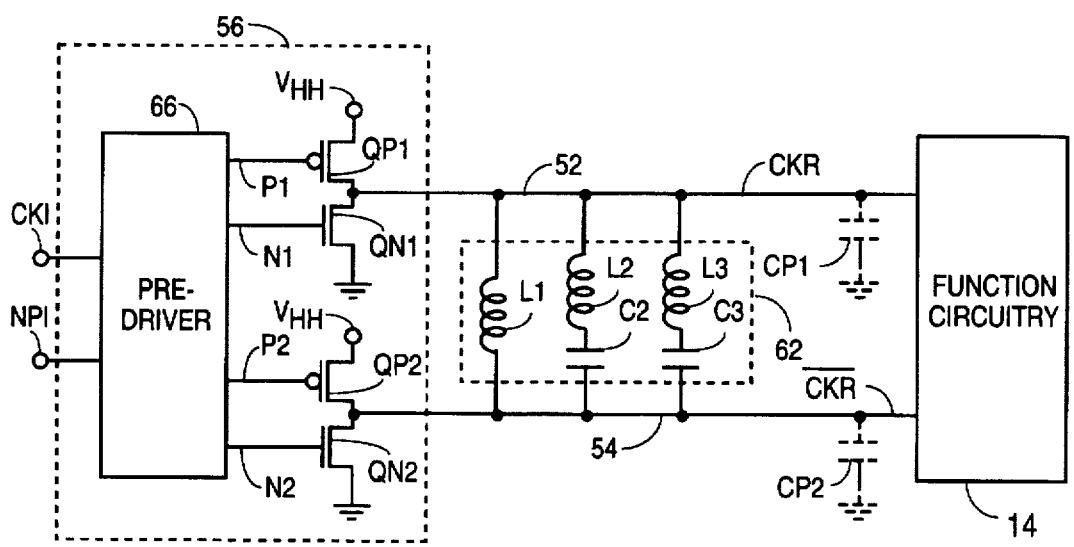
FIG. 14 is a partial circuit diagram of an embodiment in which the resonator of FIG. 13 is employed in the complementary-clock implementation of FIG. 4.

FIG. 14 depicts a partial embodiment of FIG. 4 where resonator 62 is implemented as in FIG. 13, and driver 56 consists of a pre-driver 66, a pair of serially connected complementary insulated-gate switching FETs QN1 and QP1, and a pair of serially interconnected complementary insulated-gate switching FETs QN2 and QP2. In response to input clock CKI and one or more additional input signals NPI, pre-driver 66 generates (a) a first pair of switching signals N1 and P1 that vary between ground reference and $V_{HH}$ at input frequency $f_{CKI}$ and (b) a second pair of switching signals N2 and P2 that likewise vary between ground reference and $V_{HH}$ at frequency $f_{CKI}$. FETs QN1 and QP1 furnish circuit clock CKR on line 52 in respective response to switching signals N1 and P1. FETs QN2 and QP2 similarly provide circuit clock $\overline{CKR}$ on line 54 in respective response to switching signals N2 and P2.

Figure 15:
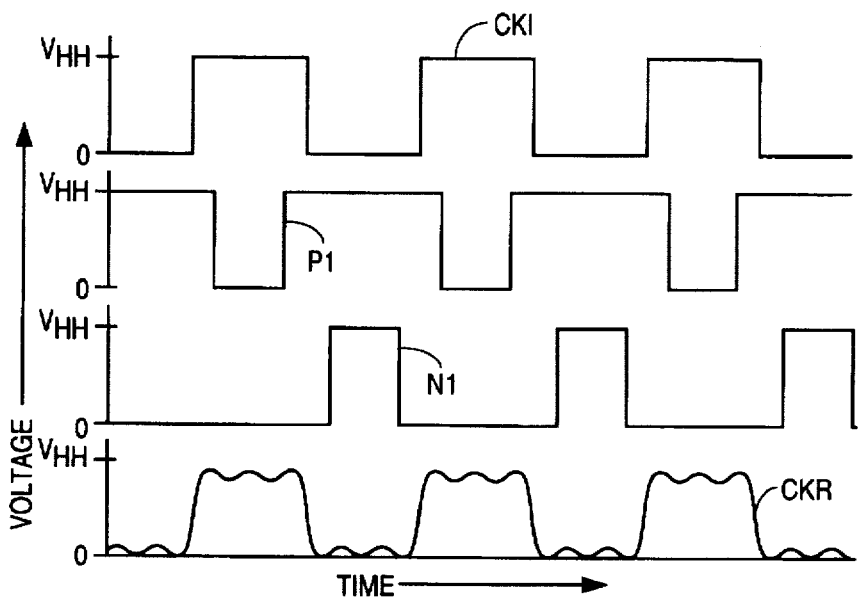
FIG. 15 is a simplified graph of waveforms that arise in the embodiments of FIGS. 14 and 29.

FIG. 15 illustrates simplified waveforms for switching signals N1 and P1. The waveforms for switching signals N2 and P2 (not shown) are respectively inverse in phase to the P1 and N1 waveforms. Each of signals N1, N2, P1, and P2 ideally has a square-wave shape. In each pair of signals Ni and Pi, where i equals 1 or 2, each signal Ni or Pi is at its active level only when the other signal Pi or Ni is at its inactive level. Hence, only one of signals Ni and Pi in each pair is active at a time. The pulse widths of signals N1, P1, N2, and P2 are determined by additional input signal(s) NPI.

By arranging for switching signals N1, P1, N2, and P2 to have the preceding characteristics, only one of FETs QNi and QPi in each FET pair is conductive at any time. At no time is a path from the $V_{HH}$ supply to ground created through (either) FET pair QNi and QPi. Also, because the (positive-going) Ni and (negative-going) Pi pulses are shorter than the CKI pulses, much of the energy dissipation that would otherwise occur in the QNi and QPi channel resistances due to the injection of current from the $V_{HH}$ supply when circuit clocks CKR and $\overline{CKR}$ are at values between $V_{HH}$ and ground reference is avoided. The power consumption is very low.

The harmonic content of the CKR and $\overline{CKR}$ waveforms can be controlled by adjusting the Ni and Pi waveforms. This also furnishes a mechanism for obtaining an optimum design trade-off between power consumption and slew rate when CKR and $\overline{CKR}$ change state. Increasing the Ni and Pi pulse widths increases the slew rate but consumes more power.

In addition to showing the N1 and P1 waveforms, FIG. 15 illustrates simplified waveforms for clocks CKI and CKR. Clock CKI is again depicted as a square wave. Because resonator 62 in FIG. 14 furnishes the third and fifth harmonics of frequency $f_R$ when it equals $f_{CKI}$, the CKR waveform is even closer to a square wave than in FIG. 12.

Figure 16:
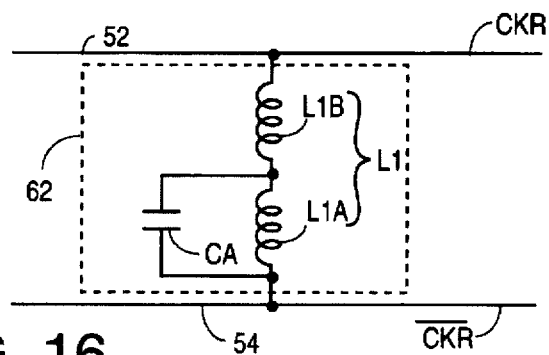
FIGS. 16, 17, 18, 19, and 20 are circuit diagrams of resonators employable in the implementations of FIGS. 4, 22–24, 26, 32, 34–37, and 39.

Referring to FIG. 16, a capacitor CA can be placed across part of inductor L1 in resonator 62. Inductor L1 then consists of portions L1A and L1B with capacitor CA connected in parallel with portion L1B. Elements L1A and L1B can be separate inductors. Resonator 62 in FIG. 16 operates in a similar manner to that of FIG. 10 to introduce the third $f_R$ harmonic frequency into the CKR and $\overline{CKR}$ waveforms.

In particular, the impedance of a capacitor decreases with increasing frequency. By appropriately choosing the value of capacitor CA, it appears largely as an open circuit at the first $f_R$ harmonic and as a short circuit at the third $f_R$ harmonic. The effective inductance $L_E$ of resonator 52 in FIG. 16 thus changes with frequency since part of the turns of inductor L1 are shorted out at high frequency. Resonance occurs at a frequency approximately equal to $\frac{1}{2} \pi \sqrt{L_E C_T}$. Consequently, a second resonance point arises at the third $f_R$ harmonic when $f_R$ equal $f_{CKI}$.

Figure 17:
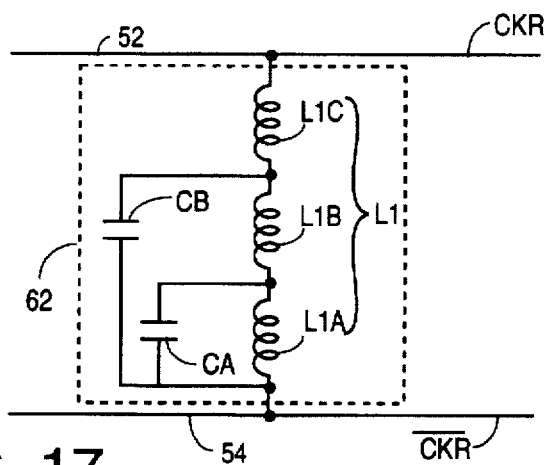

The principle of resonator 62 in FIG. 16 is readily extended to introduce odd-numbered $f_R$ harmonics above the third by utilizing two or more capacitors connected in parallel with various parts of inductor L1. FIG. 17 depicts an example in which inductor L1 is divided into three portions L1A, L1B, and L1C. Capacitor CA is again connected across portion L1A to add the third $f_R$ harmonic frequency by appropriately choosing the CA value so as to short out portion L1A at the third harmonic. In addition, a further capacitor CB is connected across portions L1A and L1B. By appropriate choice of the value of capacitor CB, it shorts out portions L1A and L1B at the fifth $f_R$ harmonic frequency to reduce $L_E$ and introduce the fifth harmonic into circuit clocks CKR and $\overline{CKR}$. Alternatively, elements L1A, L1B, and L1C can be separate inductors.

Figure 18:
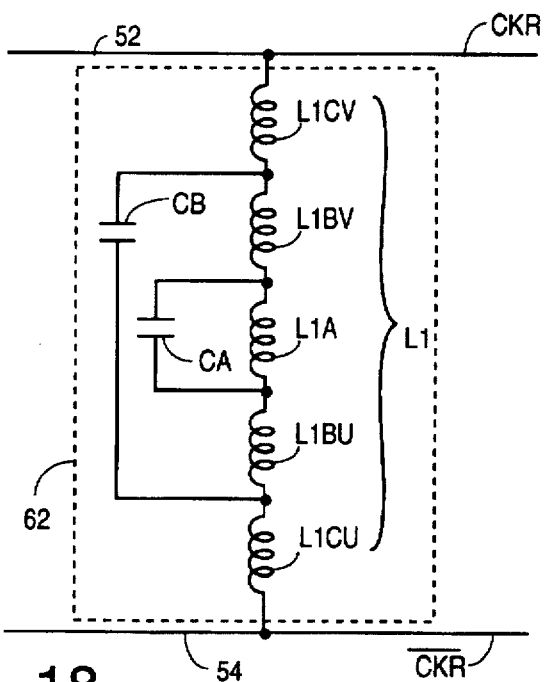

Resonator 62 of FIG. 17 can be equivalently implemented as shown in FIG. 18 where inductor L1 is divided into five portions L1A, L1BU, L1BV, L1CU, and L1CV. The sum of the L1BU and L1BV inductances equals the L1B inductance. Likewise, the sum of the L1CU and L1CV inductances equals the L1C inductance. Elements L1A, L1BU, L1BV, L1CU, and L1CV may all be separate inductors.

Figure 19:
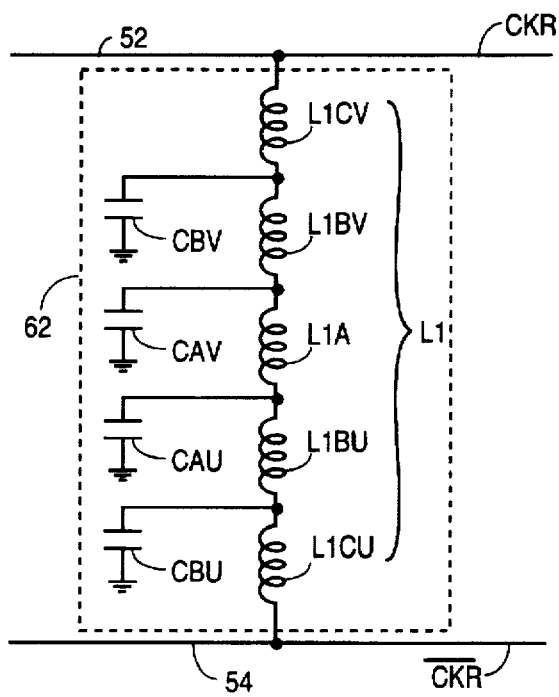

The resonance frequency characteristics of resonator 62 in FIG. 18 can alternatively be achieved by splitting each of capacitors CA and CB into two parts and grounding the lower capacitor plates. FIG. 19 shows how this alternative is achieved. Capacitor CA is replaced with a pair of equal-value capacitors CAU and CAV whose equivalent series capacitance equals the CA capacitance. Likewise, capacitor CB is replaced with a pair of equal-value capacitors CBU and CBV whose series equivalent capacitance equals the CB capacitance.

In the manner described in the last two paragraphs, resonator 62 of FIG. 16 can be equivalently implemented by simply deleting elements L1CU, L1CV, and CB in FIG. 18. The resonance frequency characteristics of the so-modified version of resonator 62 in FIG. 16 can then be alternatively achieved by simply deleting elements L1CU, L1CV, CBU, and CBV in FIG. 19. These principles readily extend to embodiments of resonator 62 having more inductor portions or inductors in series than shown in FIGS. 16–19.

Figure 20:
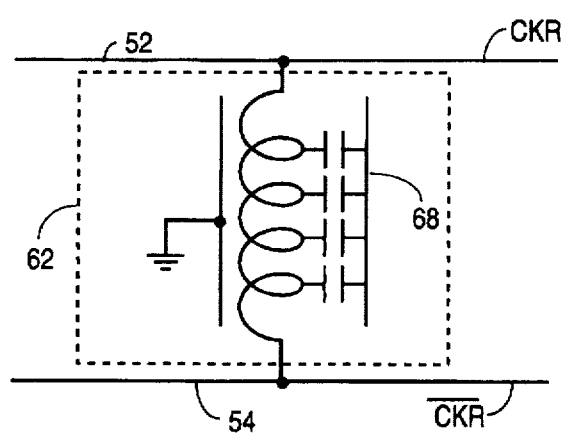

As a further alternative, the resonant frequency characteristics of resonators 62 in FIGS. 16–19 can largely be achieved by using a distributed inductance-capacitance network commonly referred to as a transmission line. An example of this is depicted in FIG. 20 where the resonator 62 consists of a transmission line 68. Although inductance and capacitance are normally distributed equally along a transmission line, the inductance and capacitance can be distributed unequally along transmission line 68. Resonator 62 in FIG. 20 is an approximate analog to resonator 62 in FIG. 19.

Figure 21:
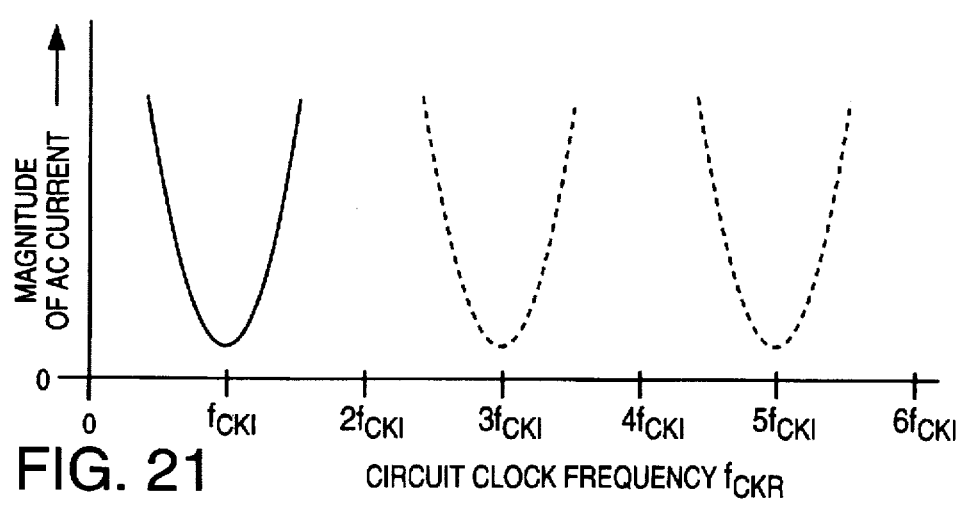
FIG. 21 is a simplified graph of AC impedance as a function of frequency for the resonators of FIGS. 5, 9, 10, 13, and 16–20.

In providing CKR and $\overline{CKR}$ waveforms with odd-numbered $f_R$ harmonics above the first harmonic, the magnitude of the AC impedance as seen from driver 56 reaches local minima when $f_{CKR}$ is at odd multiples of $f_{CKI}$. This is qualitatively illustrated in FIG. 21. Also, the phase angle of the AC impedance is approximately zero at the odd-numbered $f_R$ harmonics.

Figure 22:
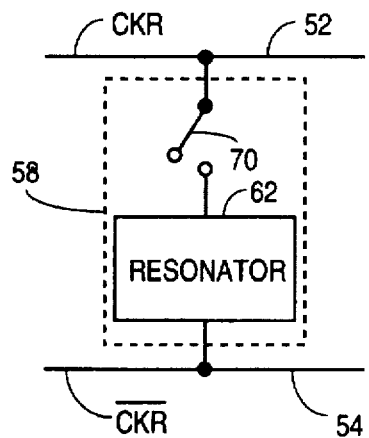
FIGS. 22 and 23 are circuit diagrams of resonating sections alternatively employable in the complementary-clock implementations of FIGS. 4, 37, and 39.
Figure 23:
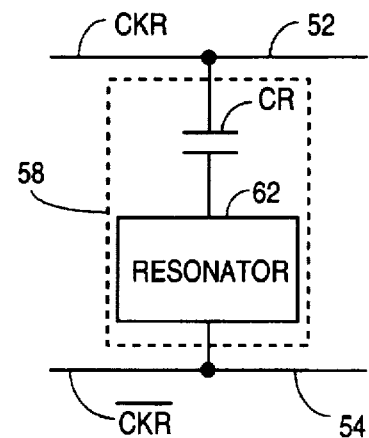

In complementary-clock embodiments where resonating section 58 is implemented with resonator 62, section 58 can be modified by placing one or two switches or one or two capacitors in series with resonator 62 between clock lines 52 and 54. FIG. 22 illustrates an example in which a switch 70 is inserted between line 52 and resonator 62. FIG. 23 depicts a similar example utilizing a capacitor CR. These two implementations of section 58 enable the clocking circuitry to go into an inactive mode without consuming shut-down power while certain other (typically asynchronous) parts of the circuit are active.

Figure 24:
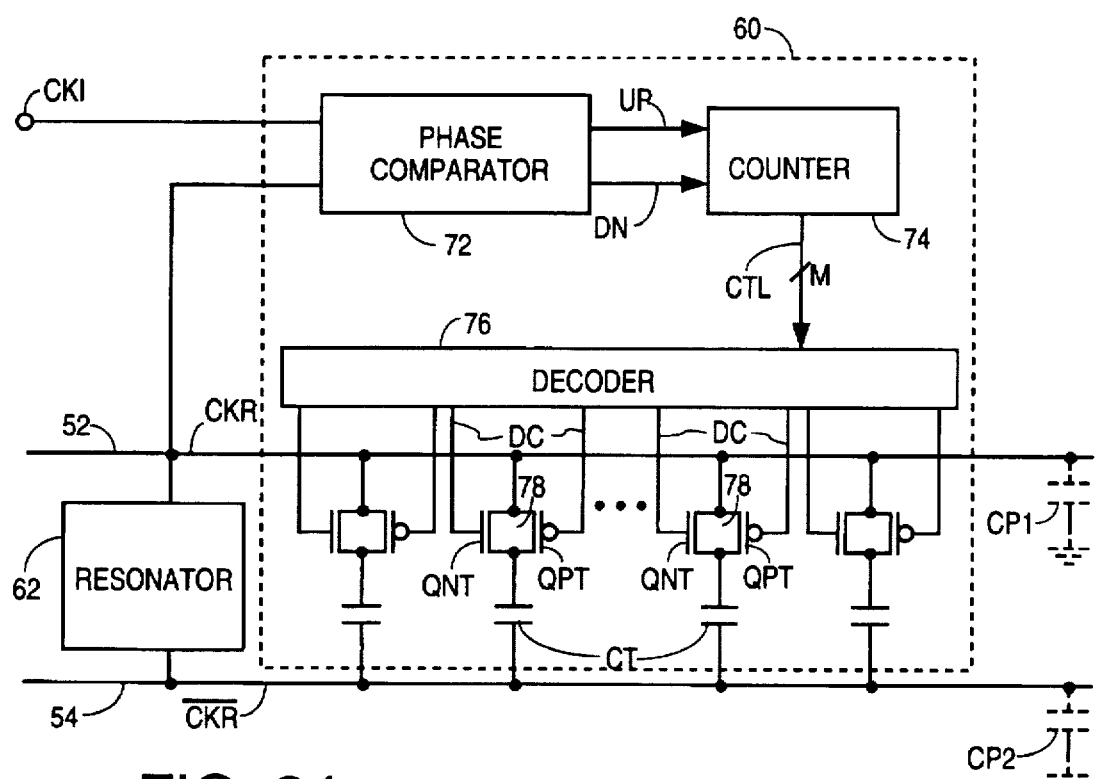
FIG. 24 is a circuit diagram of a control circuit generally employable in the complementary-clock implementation of FIG. 4, specifically in the embodiments of FIGS. 7, 8, and 14.

FIG. 24 illustrates a partial embodiment of FIG. 4 in which control circuit 60 consists of a phase comparator 72, an M-bit up/down counter 74, an M-to-$2^M$ decoder 76, $2^M$ switches 78, and $2^M$ trimming capacitors CT. M is typically 8 or more. Each switch 78 consists of a pair of complementary insulated-gate FETs QNT and QPT arranged as a transmission gate. Control 60 in FIG. 24 can be used in any of the above-described embodiments of FIG. 4 for adjusting resonance frequency $f_R$ when the nominal value $C_{P1N}$ of parasitic capacitance CP1 is less than the parasitic capacitive value that would cause $f_R$ to equal $f_{CKI}$. This embodiment of control 60 interposes one or more of capacitors CT between lines 52 and 54 so as to effectively increase $C_{P1}$ and $C_{P2}$.

Phase comparator 72 senses the phase difference between input clock CKI and circuit clock CKR. Depending on the phase difference, comparator 72 either sends a signal UP to counter 74 to cause it to count up, or a signal DN to counter 74 to cause it to count down. In response, counter 74 furnishes decoder 76 with an M-bit signal CTR that indicates the number of capacitors CT to be interposed between lines 52 and 54. Decoder 76 then sends decode signals DC that cause appropriate ones of switches 78 to be closed (activated) to place the desired amount of capacitance between lines 52 and 54.

Figure 25:
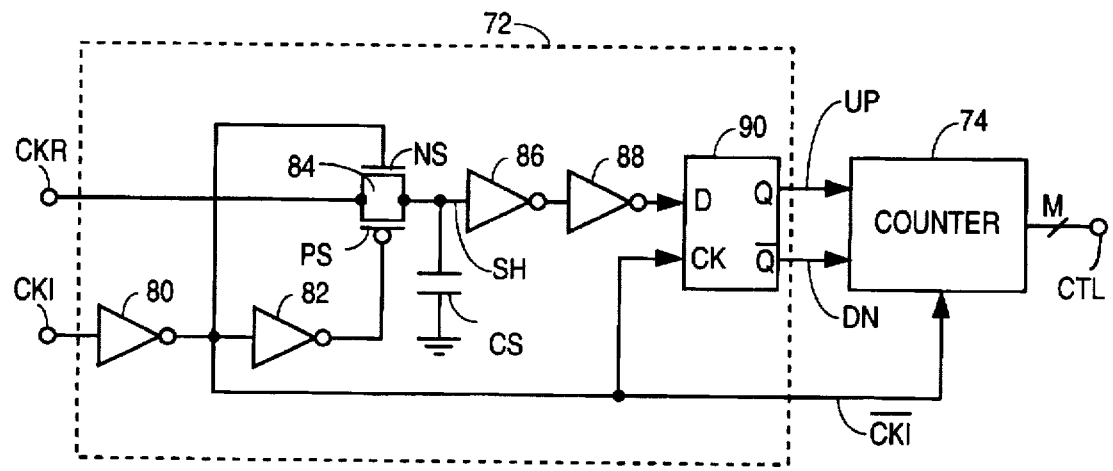
FIG. 25 is a circuit diagram of an embodiment of the phase comparator in FIG. 24.

FIG. 25 illustrates an embodiment of phase comparator 72 in FIG. 24. In FIG. 25, comparator 72 is formed with CMOS inverters 80 and 82, a transmission gate 84, a charge-storage capacitor CS, CMOS inverters 86 and 88, and a D-type flip-flop 90. Transmission gate 84 consists of a pair of complementary insulated-gate FETs NS and PS connected in parallel.

Components 80–84 and CS form a sample-and-hold subcircuit which senses the phase difference between clocks CKR and CKI by sampling the voltage level of circuit clock CKR during its rising edge in response to the rising edge of input clock CKI to produce a corresponding sample-and-hold signal SH. Inverter 80 also inverts clock CKI to produce an inverted input clock signal $\overline{CKI}$. Capacitor CS stores the sampled CKR voltage during the high CKI phase. Inverters 86 and 88 form a buffer that amplifies signal SH to a logic "1" or logic "0" depending on the sign of the phase difference. When clock CKI goes low, the amplified SH signal is loaded into flip-flop 90 whose Q and $\overline{Q}$ outputs provide signals UP and DN to counter 74 in synchronism with input clock $\overline{CKI}$.

When resonance frequency $f_R$ is greater than input frequency $f_{CKI}$, the CKR waveform leads the CKI waveform. The phase difference is positive. Flip-flop 90 receives a "1" which causes counter 74 to count up. The reverse occurs when $f_R$ is less than $f_{CKI}$ so as to cause counter 74 to count down.

Figure 26:
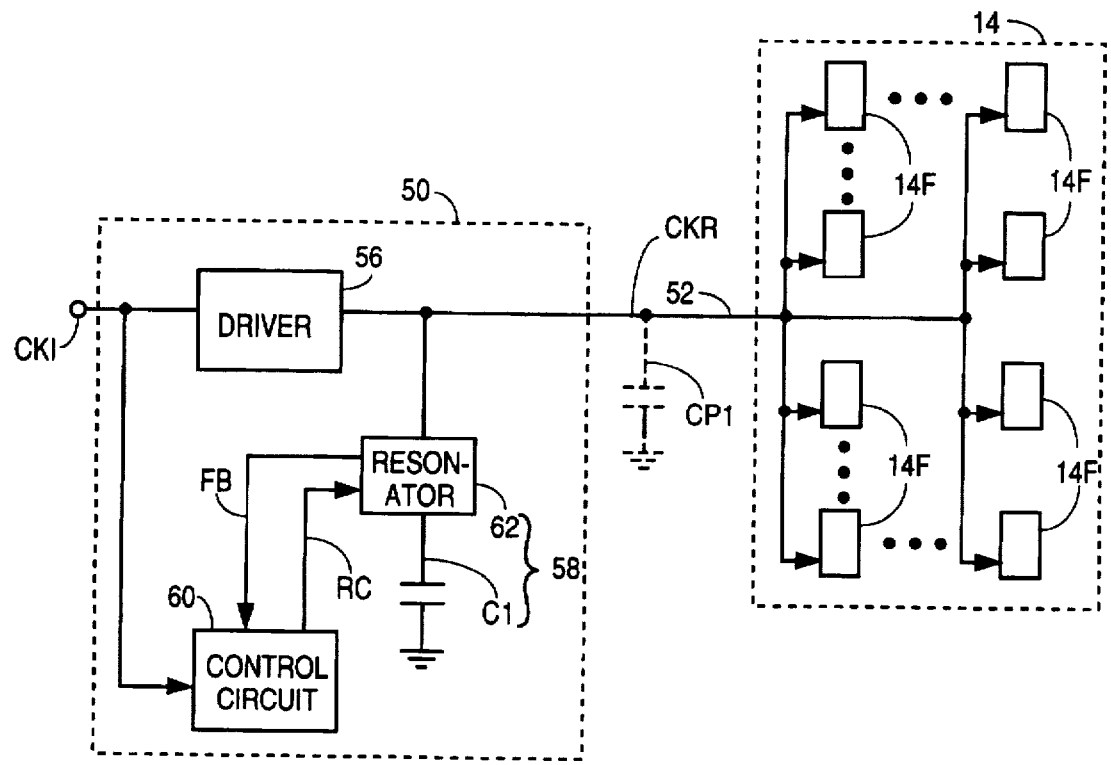
FIG. 26 is a circuit diagram of a single-clock implementation of the synchronous circuit in FIG. 3.

FIG. 26 illustrates a single-clock implementation of the synchronous circuit in FIG. 3. In this single-clock implementation, resonating section 58 of FIG. 3 consists of passive resonator 62 and a non-parasitic resonance capacitor C1 connected in series between circuit clock line 52 and circuit ground. Any of the embodiments of resonator 62 shown in FIGS. 5, 9, 10, 13, and 16–20 can be used in the implementation of FIG. 26. Function circuitry 14 in FIG. 26 consists of function elements. 14F that receive circuit clock CKR on line 52 by way of the clock net.

When circuit clock CKR goes from-high to low during a half clock cycle so as to cause parasitic capacitance CP1 to discharge, the CP1 charge largely flows along line 52 and through resonator 62 to capacitor C1 which thereby charges up. During the next half clock cycle when CKR returns to its high value, the charge in capacitor C1 flows back through resonator 62 and along line 52 to recharge capacitance CP1. The charge on capacitance CP1 is thus reused to keep power consumption low.

Figure 27:
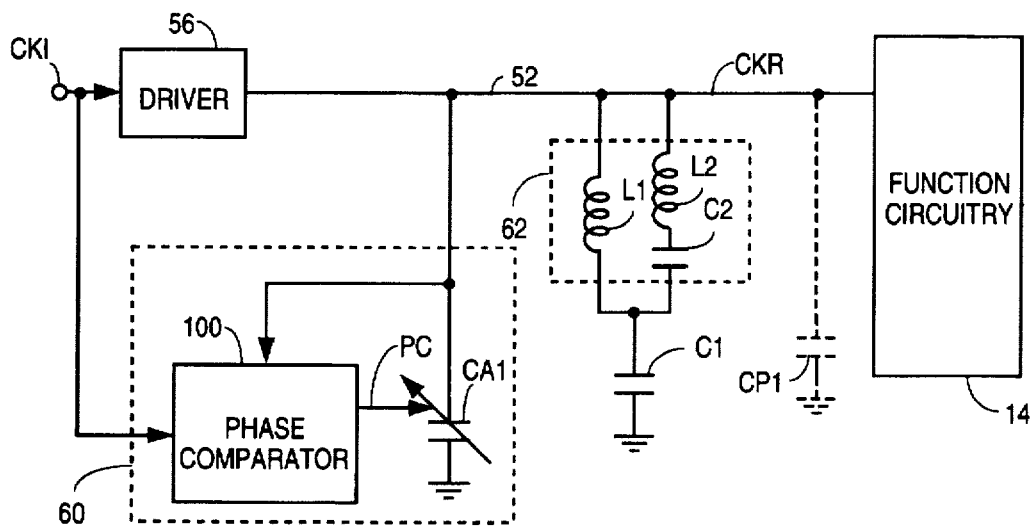
FIG. 27 is a circuit diagram of an embodiment in which the resonator of FIG. 10 is utilized in the single-clock implementation of FIG. 26.

FIG. 27 depicts an embodiment of FIG. 26 in which resonator 62 is implemented as in FIG. 10, and control circuit 60 consists of a phase comparator 100 and variable capacitor CA1. Phase comparator 100 senses the phase difference between clocks CKR and CKI. Comparator 100 then adjusts resonance frequency $f_R$ by supplying control signal PC to capacitor CA1 to increase or decrease its capacitance. Control 60 in FIG. 27 is utilized when nominal parasitic capacitive value $C_{P1N}$ is less than the parasitic capacitive value that would cause $f_R$ to equal $f_{CKI}$.

Figure 28:
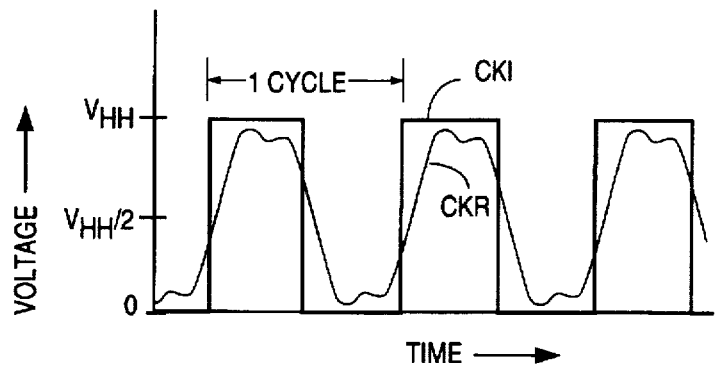
FIG. 28 is a simplified graph of waveforms that arise when the resonator of FIG. 10 is utilized in the single-clock implementation of FIG. 26.

FIG. 28 illustrates simplified clock waveforms for the circuit of FIG. 27. Elements L2 and C2 in resonator 62 of FIG. 27 are chosen so as to incorporate the third $f_R$ harmonic into the CKR waveform. As shown in FIG. 28, the CKR waveform thereby provides a reasonable approximation to a square wave.

Figure 29:
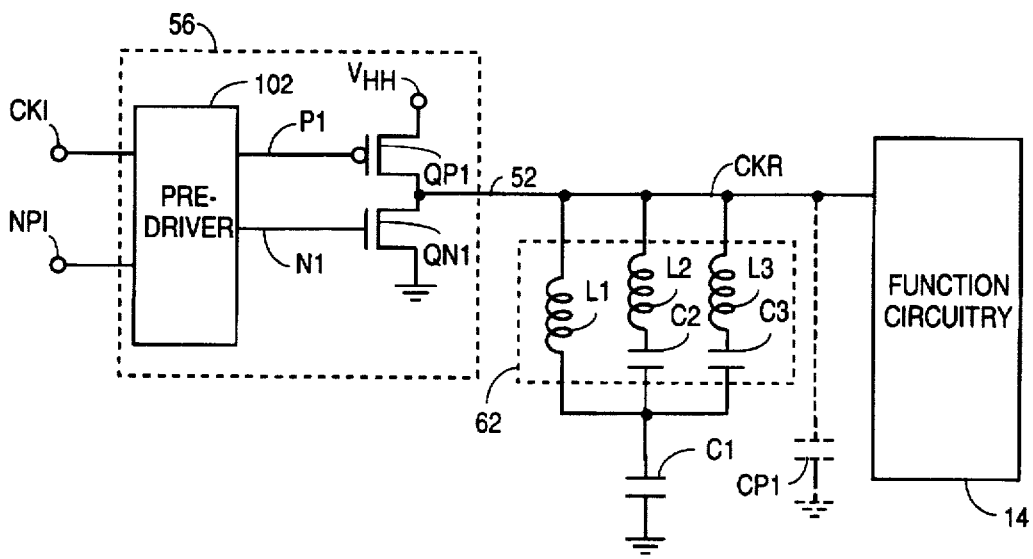
FIG. 29 is a partial circuit diagram of an embodiment in which the resonator of FIG. 13 is utilized in the single-clock implementation of FIG. 26.

FIG. 29 illustrates a partial embodiment of FIG. 26 where resonator 62 is implemented as in FIG. 13, and driver 56 consists of a pre-driver 102 and complementary FETs QN1 and QP1 as in driver 56 of FIG. 14. Pre-driver 102 in FIG. 29 furnishes switching signals N1 and P1 in response to input clock CKI and additional input signal(s) NPI. Signals N1 and P1 have the characteristics described above in connection with FIGS. 14 and 15. FETs QN1 and QP1 likewise respond to signals N1 and P1 in the manner described above for FIG. 14. The circuit in FIG. 29 thus has the same type of power advantages-as the circuit of FIG. 14. The simplified CKI and CKR clock waveforms of FIG. 15 also apply to the circuits of FIG. 29.

Figure 30:
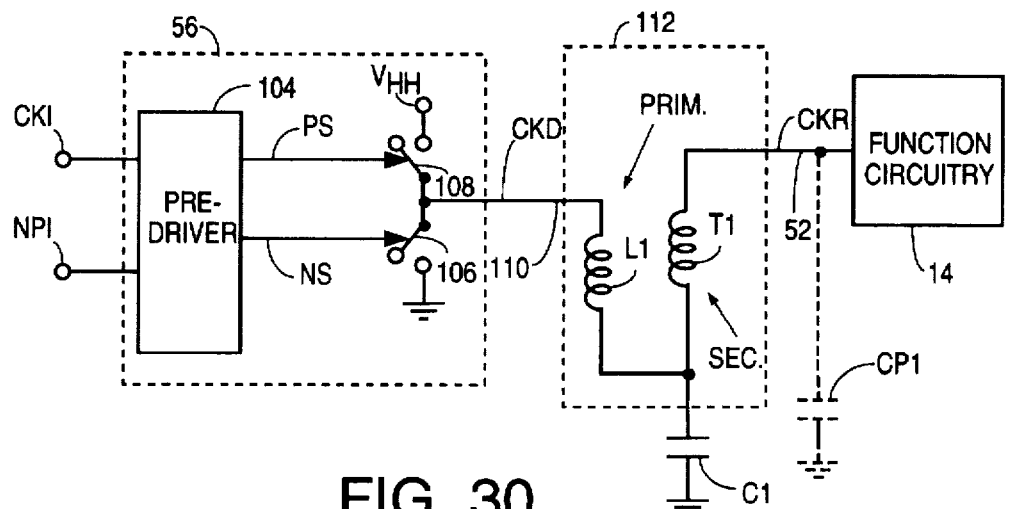
FIG. 30 is a partial circuit diagram of a single-clock implementation of the circuit in FIG. 3.
Figure 31:
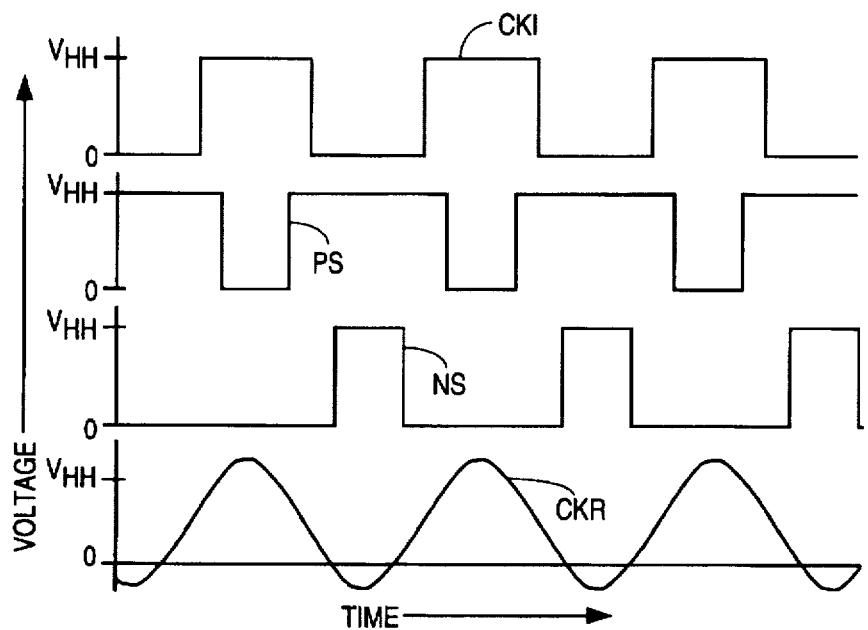
FIG. 31 is a simplified graph of waveforms that arise in the implementation of FIG. 30.

Turning to FIG. 30, it illustrates a partial single-clock implementation of the circuit of FIG. 3 where driver 56 consists of a pre-driver 104 and a pair of switches 106 and 108. In response to input clock CKI and input signal(s) NPI, pre-driver 104 generates switching signals NS and PS that typically have the characteristics described above for switching signals N1 and P1. FIG. 31 illustrates simplified waveforms for signals NS and PS. Switches 106 and 108 are connected in series between the $V_{HH}$ supply and ground. The interconnection point of switches 106 and 108 provides driver clock signal CKD on a driver clock line 110. Switches 106 and 108 operate in response to signals NS and PS in the same way that FETs QN1 and QP1 respond to signals N1 and P1 in the circuits of FIGS. 16 and 26. Consequently, driver 56 in FIG. 30 generates driver clock signal CKD at low power consumption.

Resonating section 58 of FIG. 3 is implemented in FIG. 30 with a resonator 112 and resonance capacitor C1 whose lower plate is grounded. Resonator 112 consists of a transformer T1 whose primary coil is connected between line 110 and the upper C1 plate. The secondary coil of transformer T1 is connected between circuit clock line 52 and the upper C1 plate. Transformer T1 enables circuit clock CKR to have a greater voltage swing than input clock CKI. FIG. 31 also indicates simplified versions of the CKI and CKR waveforms. The secondary coil of transformer T1 may utilize, or be modified to utilize, any of the arrangements of FIGS. 10, 13, and 16–20.

Figure 32:
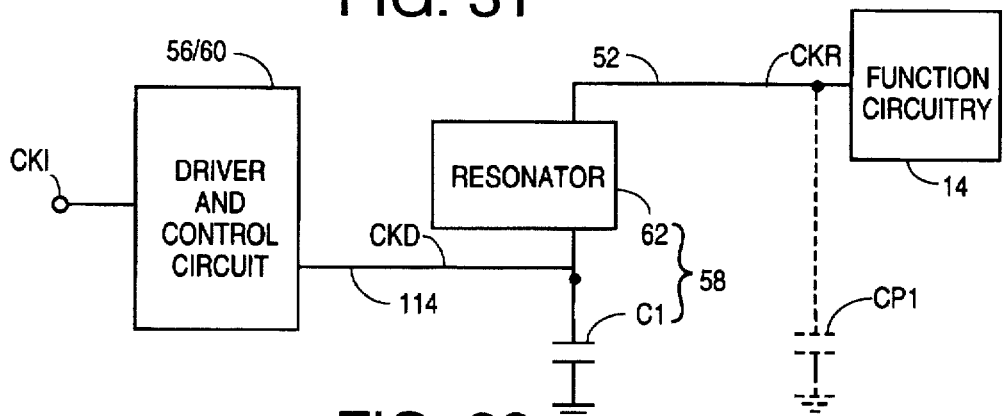
FIG. 32 is a circuit diagram of a single-clock implementation of the circuit in FIG. 3.

FIG. 32 depicts a single-clock implementation of FIG. 3 in which components 56 and 60 are merged into a composite driver/control circuit 56/60 that provides driver clock signal CKD on a driver clock line 114. In FIG. 32, resonating section 58 of FIG. 3 again consists of passive resonator 62 and capacitor C1. Resonator 62 in FIG. 32 can be implemented using any of the embodiments of FIGS. 5, 9, 10, 13, and 16–20. Instead of circuit clock line 52 being connected to driver/control circuit 56/60, the interconnection node between resonator 62 and capacitor C1 is connected to circuit 56/60 by way of driver clock line 114.

The value C1 of capacitor C1 in the circuit of FIG. 32 is chosen to significantly exceed the nominal value $C_{P1N}$ of parasitic capacitance CP1. This enables capacitor C1 to hold a greater charge than capacitance CP1 at a given voltage. A voltage magnification approximately equal to $C_1/C_{P1N}$ thereby occurs when the C1 charge is transferred to capacitance CP1. Because driver clock CKD is supplied to the node between capacitor C1 and resonator 62, circuit clock CKR achieves a greater voltage swing than both driver clock CKD and input clock CKI.

Figure 33:
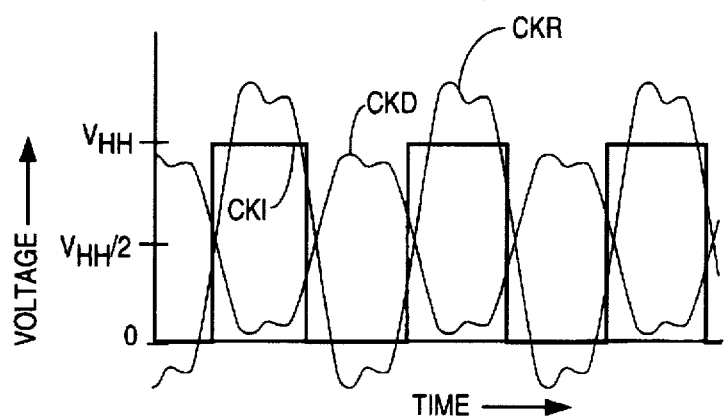
FIG. 33 is a simplified graph of waveforms that arise in the implementation of FIG. 32.

The CKR voltage swing in the circuit of FIG. 32 also exceeds the supply voltage for the circuit. For example, when $V_{HH}$ is 5 volts, circuit clock CKR can attain a voltage swing of 7 volts. The increased CKR voltage swing is obtained without adding a second power supply. FIG. 33 illustrates the increased CKR voltage swing for the case in which the CKR waveform include the third $f_R$ harmonic. Aside from the unbalanced capacitive values and the different connections for resonator 62, the circuit in FIG. 32 basically operates in the manner described above for FIG. 26.

Figure 2:
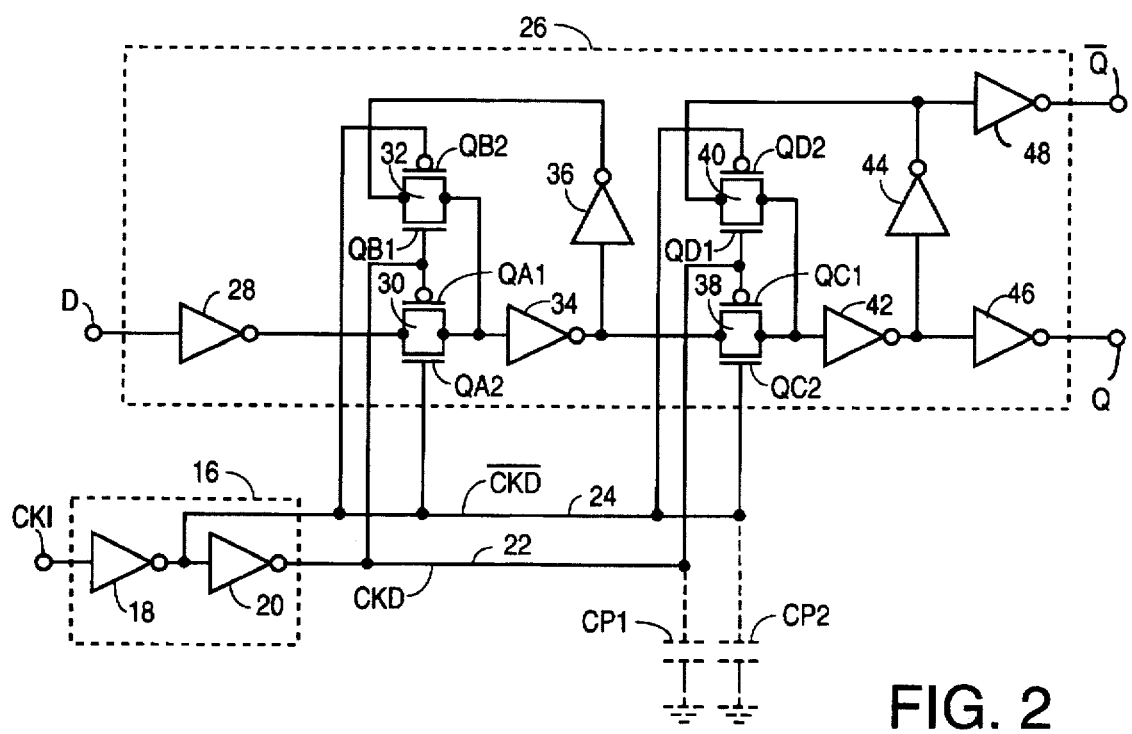
Figure 34:
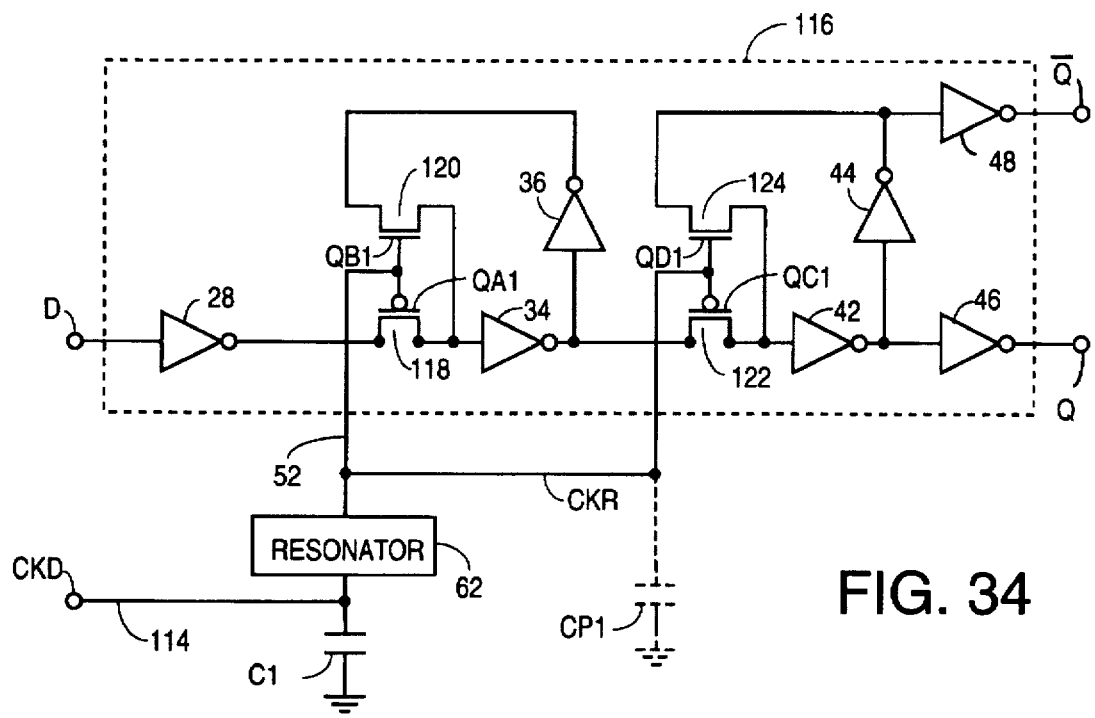
FIG. 34 is a partial circuit diagram of an embodiment of the single-clock implementation in FIG. 32.

FIG. 34 illustrates a partial embodiment of FIG. 32 in which function circuitry 14 contains a flip-flop 116 similar to flip-flop 26 in FIGS. 2 and 7. Flip-flop 116 consists of a data input buffer, a master portion, a slave portion, and an output buffer. As in FIGS. 2 and 7, the input buffer is formed with CMOS inverter 28 while the output buffer consists of CMOS inverters 46 and 48.

The master portion of flip-flop 116 is formed with transmission gates 118 and 120 and CMOS inverters 34 and 36. The slave portion is formed with transmission gates 122 and 124 and CMOS inverters 42–44. Instead of being CMOS gates like transmission gates 30, 32, 36, and 38 in FIGS. 2 and 7, transmission gates 118–124 in FIG. 34 are single-FET gates respectively formed with FETs QA1–QD1. Because the CKR voltage swing goes somewhat below ground and somewhat above $V_{HH}$, the second FET used in each of gates 30, 32, 36, and 38 of FIGS. 2 and 7 is not necessary in the circuit of FIG. 34. The part count is thereby reduced.

Figure 35:
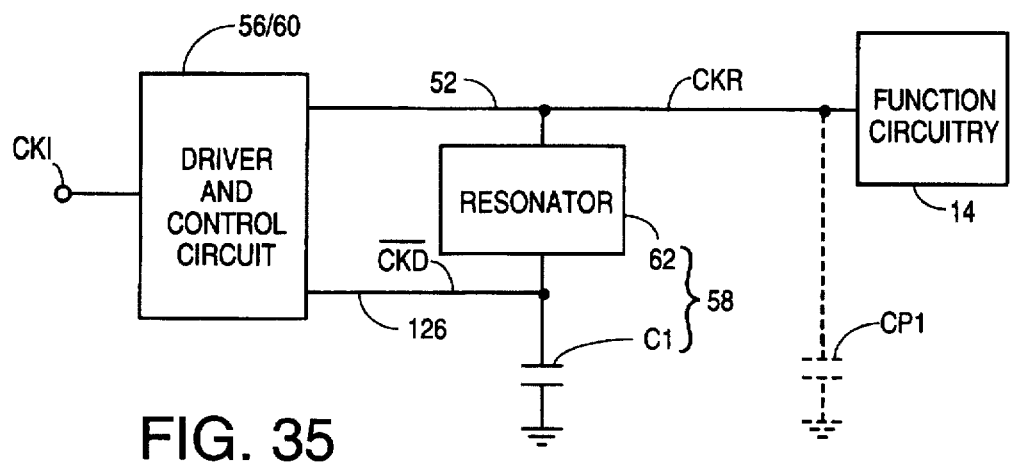
FIGS. 35 and 36 are circuit diagrams of single-clock implementations of the circuit in FIG. 3.

FIG. 35 illustrates a hybrid single-clock implementation of the circuit in FIG. 3 where components 56 and 60 are again merged into driver/control circuit 56/60. In this case, circuit 56/60 furnishes circuit clock CKR and driver clock $\overline{CKD}$ respectively on circuit clock line 52 and a driver clock line 126. Clocks CKR and $\overline{CKD}$ are complementary to each other. Resonating section 58 of FIG. 3 again consists of resonator 62 and resonance capacitor C1 in FIG. 35. Driver clock line 126 is connected to the interconnection point between capacitor C1 and resonator 62.

The circuit in FIG. 35 basically operates in the manner described above for the circuit of FIG. 26. Because clocks CKR and $\overline{CKD}$ are complementary, the CKR waveform should be quite symmetrical.

Figure 36:
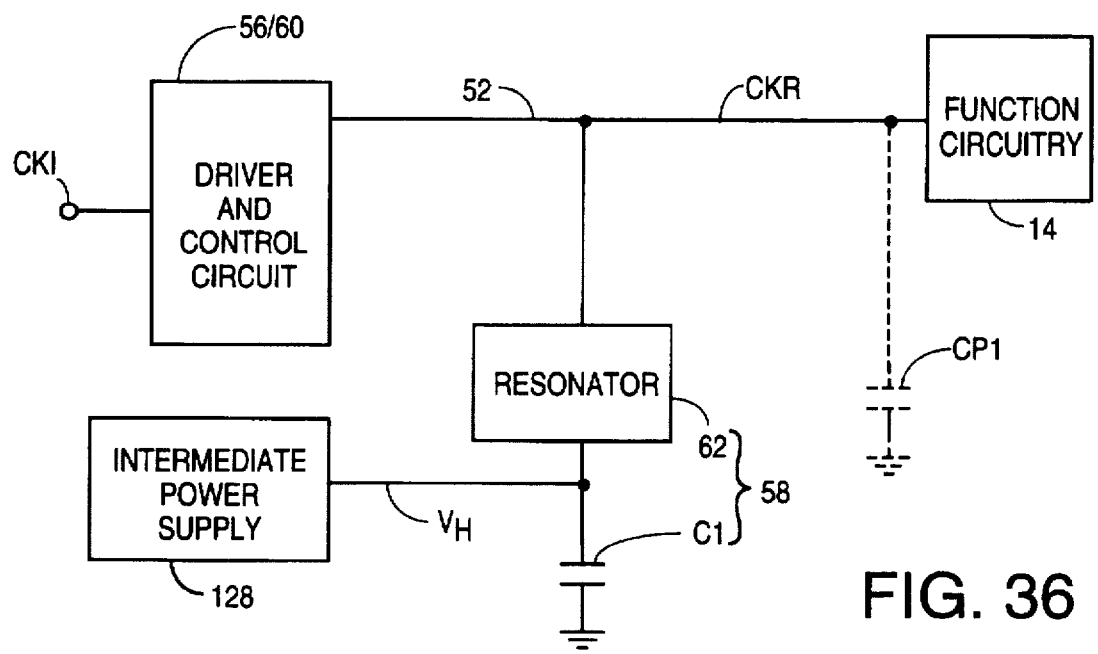

FIG. 36 depicts another single-clock implementation of the circuit in FIG. 3 where components 56 and 60 are merged into driver/control circuit 56/60. Resonator 62 in FIG. 36 is connected between circuit clock line 52 and a low-impedance source 128 that provides an intermediate power supply voltage $V_H$ approximately equal to the time-averaged voltage of circuit clock CKR. Typically, supply voltage $V_H$ is $V_{HH}/2$.

When parasitic capacitance CP1 discharges during a half clock cycle in the circuit of FIG. 36, the CP1 charge is largely transferred to $V_H$ supply 128. During the next half clock cycle, supply 128 charges capacitance CP1, thereby keeping power consumption very low. Capacitor C1 may optionally be connected between resonator 62 and ground to ensure that system efficiency is high.

In some of the previous embodiments of FIG. 3, driver 56 can be replaced with an oscillator that is not directly forced by an external stimulus such as input clock CKI. Instead, the forcing stimulus is derived from internal circuit clock CKR and/or internal circuit clock $\overline{CKR}$ so as to provide the phase shift needed to induce oscillation. Equivalently, driver 56 can be converted into such an internally driven oscillator by coupling clock CKR or $\overline{CKR}$ back to the CKI input of driver 56.

The internally driven oscillator tends to oscillate at resonance frequency $f_R$. Controlling frequency $f_R$ thereby controls circuit clock frequency $f_{CKR}$. The oscillator becomes a controllable oscillator employable, for example, in a phase-locked loop. One or more dividers or multipliers may be used to generate $f_{CKR}$ at some multiple or fraction of an external reference frequency.

Figure 37:
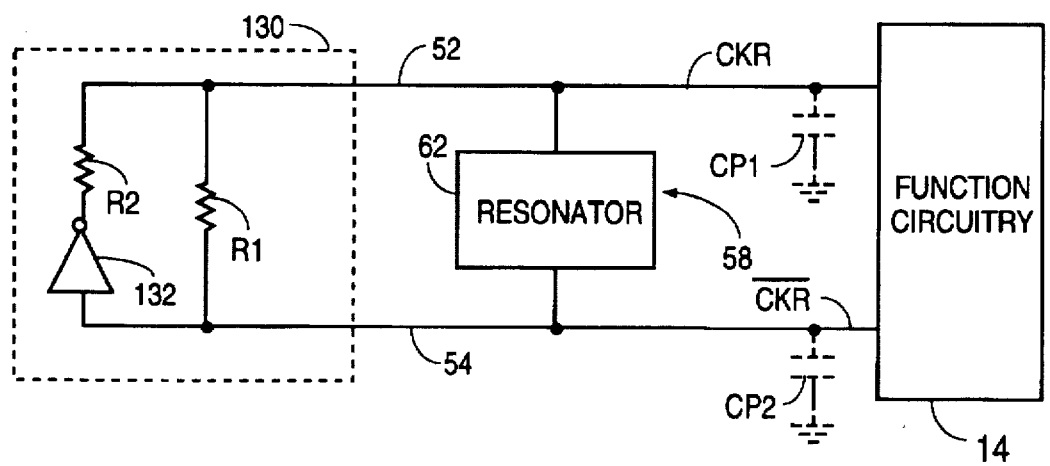
FIG. 37 is a partial circuit diagram of a variation of the complementary-clock implementation in FIG. 4.

FIG. 37 depicts a partial implementation of the circuit in FIG. 4 where driver 56 is replaced with an internally driven oscillator 130 connected between internal clock lines 52 and 54. Oscillator 130 contains an inverter circuit formed with a single CMOS inverter 132. Alternatively, the inverter circuit could be formed with an odd number of CMOS inverters connected front-to-back in series. Oscillator 130 also contains resistors R1 and R2 that provide bias and impedance matching.

Figure 38:
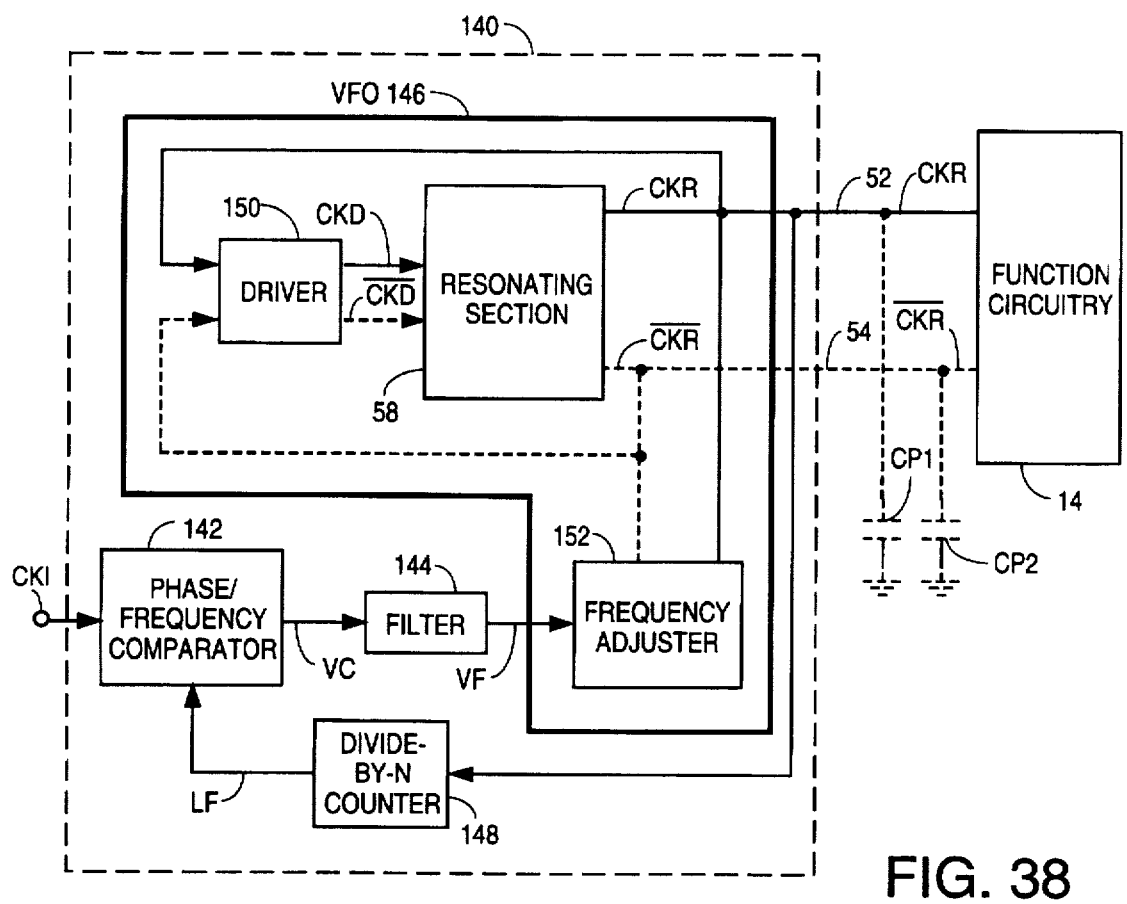
FIG. 38 is a general block diagram of another synchronous electronic circuit that utilizes a resonant system in accordance with the invention.

FIG. 38 illustrates a general configuration for a synchronous electronic circuit containing a resonant system 140 that supplies clock pulses to function circuitry 14 at low power consumption according to the invention. Resonant system 140 oscillates at circuit clock frequency $f_{CKR}$ in response to input (or reference) clock signal CKI at input clock frequency $f_{CKI}$. In system 140, $f_{CKR}$ is substantially an integer multiple of $f_{CKI}$, where the lowest integer multiplier is 1. Accordingly, $f_{CKR}$ is substantially proportional to $f_{CKI}$.

Resonant system 140 supplies circuit clock CKR to function circuitry 14 and, in complementary-clock implementations, supplies circuit clock $\overline{CKR}$ to circuitry 14. Parasitic capacitance CP1 associated with circuit clock line 52 and, when present, parasitic capacitance CP2 associated with circuit clock line 54 have the meanings described above in connection with the circuit of FIG. 3. Aside from the fact that $f_{CKR}$ is substantially proportional to $f_{CKI}$ but (unlike the circuit of FIG. 3) is not necessarily substantially equal to $f_{CKI}$, clocks CKI, CKR, and $\overline{CKR}$ have the characteristics described above in connection with the circuit of FIG. 3.

Resonant system 140 consists of a phase/frequency comparator 142, a low-pass filter 144, a variable-frequency oscillator ("VFO") 146, and an optional divide-by-N pulse counter 148 all arranged in a phase-locked loop. The input signals to phase/frequency comparator 142 are input clock CKI and a loop feedback signal LF at a feedback clock frequency $f_{LF}$. Comparator 142 senses the difference between frequencies $f_{CKI}$ and $f_{LF}$ and provides a comparator voltage signal VC indicative of the frequency difference. Filter 144 filters signal VC to produce a control voltage signal VF.

VFO 146 oscillates at circuit clock frequency $f_{CKR}$ as determined by control signal VF. VFO 146 also furnishes circuit clock CKR and, when present, circuit clock $\overline{CKR}$. In response to clock CKR, pulse counter 148 divides $f_{CKR}$ by an integer N to produce feedback signal LF at frequency $f_{LF}$. That is, $f_{LF}$ approximately equals $f_{CKR}/N$. If counter 148 is not present, the loop is completed by supplying clock CKR directly to the LF input of comparator 142. The phase-locked loop forces $f_{LF}$ to be substantially equal to $f_{CKI}$. Consequently, $f_{CKR}$ substantially equals $Nf_{CKI}$ where N is 1 in the absence of counter 148.

VFO 146 is formed with a small driver 150, resonating section 58, and frequency adjustor 152. Driver 150 generates driver clock signal CKD in response to circuit clock CKR and/or circuit clock $\overline{CKR}$. Driver 150 may also generate circuit clock signal $\overline{CKD}$. Responsive to driver clock CKD and, when present, driver clock $\overline{CKD}$, resonating section 58 produces circuit clocks CKR and $\overline{CKR}$ in the manner described above in connection with FIG. 3. Depending on the configurations of components 150 and 58, clocks CKR and CKD may be the same clock. Likewise, clocks $\overline{CKR}$ and $\overline{CKD}$ may be the same. Frequency adjustor 152 controls the value of $f_{CKR}$ in response to control voltage VF.

Resonant system 140 transfers charge between parasitic capacitance CP1 and a temporary storage site in the manner described above for resonant system 50 in FIG. 3. As with system 50, the temporary storage site is usually a capacitor in a single-clock implementation of system 140. In this case, resonating section 58 typically consists of resonator 62 in series with the capacitor. In a complementary-clock implementation, the temporary storage site is normally parasitic capacitance CP2. Section 58 then simply consists of resonator 62. System 140 oscillates very close to its fundamental resonance frequency $f_R$ in largely the same manner as system 50.

In essence, components 142, 144, and 148–152 in resonant system 140 form a controllable driver that, like the controllable driver formed by components 56 and 60 in resonant system 50, operates in response to input clock CKI for providing the small amount of energy needed to sustain the oscillations of resonating section 58 at circuit clock frequency $f_{CKR}$ very close to resonance frequency $f_R$. The two drivers differ in that $f_{CKR}$, and thus $f_R$, can exceed input clock frequency $f_{CKI}$ in system 140 but are substantially equal to $f_{CKI}$ in system 50.

Figure 39:
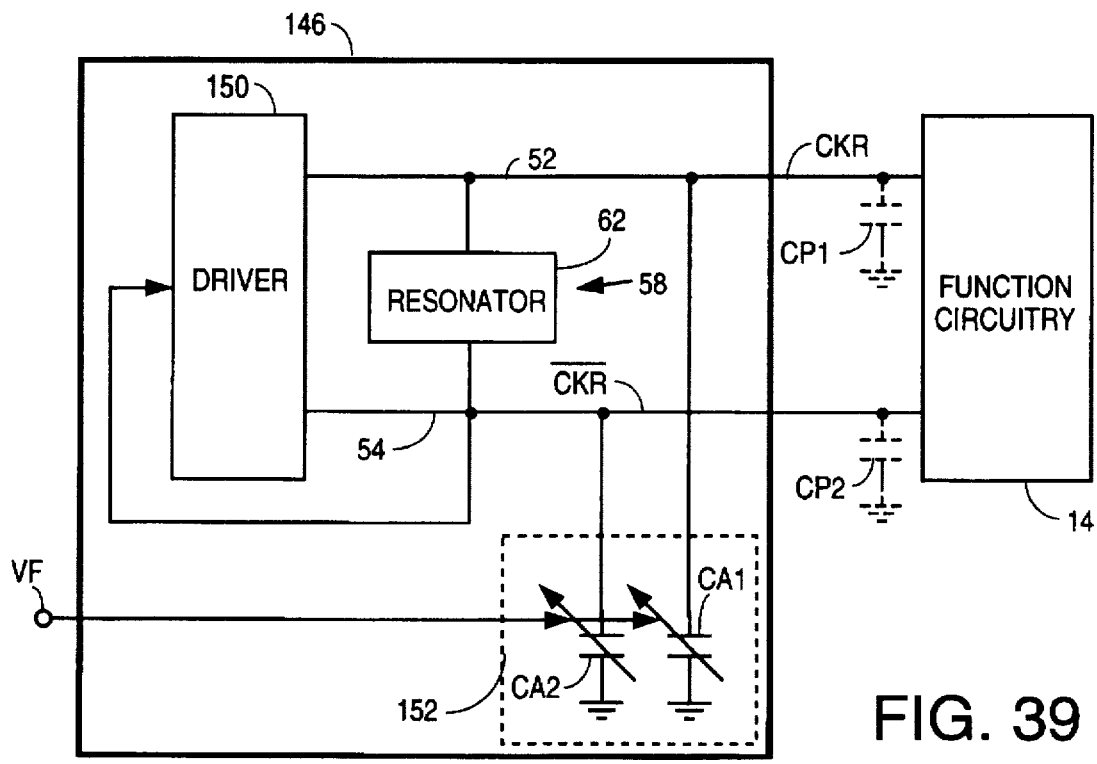
FIG. 39 is a circuit diagram of an embodiment of the variable-frequency oscillator in FIG. 38.

FIG. 39 shows part of a complementary-clock implementation of the synchronous circuit in FIG. 38. Resonating section 58 here consists of resonator 62 connected between lines 52 and 54. Resonator 62 in FIG. 39 can be implemented with any of the embodiments shown in FIGS. 5, 9, 10, 13, and 16–20. Frequency adjustor 152 is formed with variable capacitors CA1 and CA2 whose values are controlled by voltage VF. Because capacitors CA1 and CA2 are respectively in parallel with parasitic capacitances CP1 and CP2, the nominal CP1 and CP2 values are usually less than the parasitic capacitive values which would cause the phase-locked loop to lock onto input clock CKI.

Figure 40:
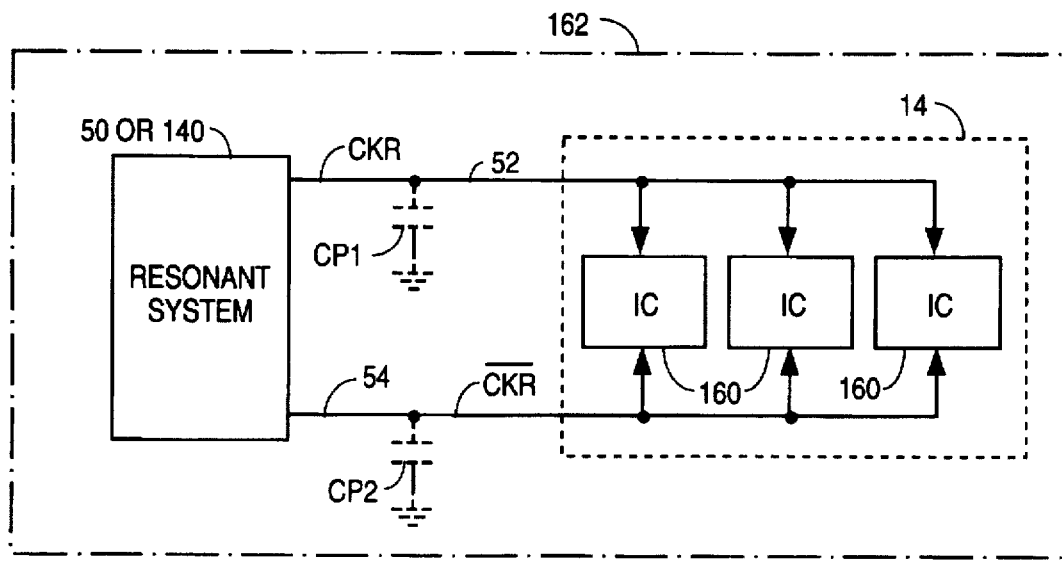
FIG. 40 is a partial circuit diagram of an implementation of the synchronous circuit in FIG. 3 or 38.

The synchronous circuit of FIG. 3 or 38 is often a single monolithic IC. Alternatively, function circuitry 14 can be divided among multiple monolithic ICs mounted on a common substrate. Resonant system 50 or 140 may be part of one of these ICs or contained in a separate monolithic IC. However, resonator 62 and, when present, capacitor C1 are often (a) provided as discrete components separately mounted on the substrate, (b) formed by metalization and dielectric layers on the substrate, or (c) provided on a separate substrate. Ceramic typically yields the best stability and performance as the substrate material. FIG. 40 illustrates part of a complementary-clock implementation of FIG. 3 or 38 in which the components of circuitry 14 are distributed among a group of monolithic ICs 160 mounted on a ceramic substrate 162.

While the invention has been described with reference to particular embodiments, this description is solely for the purpose of illustration and is not to be construed as limiting the scope of the invention claimed below. For example, the components of function circuitry 14 as well as resonant systems 50 and 140 could be implemented in bipolar or BiCMOS technology. PZT-type piezoelectric material may be suitable for manufacturing the elements of resonator 62.

Adjustable capacitors could be implemented with varicap diodes—i.e., reverse-biased semiconductor diodes whose capacitances depend on the applied reverse-bias voltages. Lower capacitor plates described as being connected to ground could generally be connected to a source of a voltage whose frequency is much lower than $f_{CKR}$, typically at least ten times lower.

Analogous to what is shown in FIG. 24 for complementary-clock implementations, a controllable capacitance network for single-clock implementations could be formed with a group of capacitor-gate pairs connected in parallel between circuit clock line 52 and ground, each capacitor-gate pair consisting of a transmission gate in series with a trimming capacitor. The transmission gate could be formed with a single insulated-gate FET or a pair of complementary insulated-gate FETs connected in parallel. Two such grounded networks could be used in complementary-clock implementations, one connected to each of clock lines 52 and 54.

A frequency multiplier or divider could be placed at the input to driver 56 in the circuit of FIG. 3. As a result, $f_{CKR}$ would substantially equal the resultant multiple or fraction of $f_{CKI}$.

As transistor switching speeds increase, parasitic inductances cause ringing problems to become progressively more severe. The resonance technique of the invention could be utilized to partially overcome the ringing by utilizing a resonance inductor whose inductance approximately equals the value needed for resonance minus the estimated value of the parasitic inductance. Various modifications and applications may thus be made by those skilled in the art without departing from the true scope and spirit of the invention as defined in the appended claims.

I claim:

1. An electronic circuit comprising:
   a resonant system which, in response to an input clock signal at an input clock frequency, oscillates at a circuit frequency substantially proportional to the input clock frequency to generate a first circuit clock signal at the circuit frequency; and
   digital function circuitry which performs electronic functions in synchronism with the circuit clock signal, clock inputs of the function circuitry receiving the circuit clock signal from a first circuit clock line, the resonant system being operated close to a fundamental resonance frequency such that a resonator in the resonant system is largely in resonance at least with capacitance and/or inductance associated with the circuit clock line and the clock inputs, oscillations of the resonant system including frequency components attributable to the fundamental resonance frequency and at least one resonance frequency of the resonant system other than the fundamental resonance frequancy.

2. An electronic circuit as in claim 1 wherein the resonant system includes a non-parasitic capacitor coupled between the resonator and a source of a substantially fixed reference voltage or other voltage at a much lower frequency than the circuit frequency, the resonator being coupled to the circuit clock line.

3. An electronic circuit as in claim 2 wherein the resonator comprises a non-parasitic main inductive device comprising an inductor or a group of inductors coupled to one another in series.

4. An electronic circuit as in claim 3 wherein the main inductive device has a controllably variable inductance.

5. An electronic circuit as in claim 3 wherein the resonator includes at least one inductive-capacitive arrangement coupled in parallel with at least part of the main inductive device, each inductive-capacitive arrangement comprising an inductor and a capacitor coupled to each other in series.

6. An electronic circuit as in claim 3 wherein the resonator includes at least one capacitor coupled in parallel with part of the main inductive device.

7. An electronic circuit as in claim 2 wherein the resonator includes at least one capacitor coupled between an internal point of the main inductive device and a source of a substantially fixed reference voltage or other voltage at a much lower frequency than the circuit frequency.

8. An electronic circuit as in claim 2 wherein the resonator includes a distributed capacitor coupled to multiple points of the main inductive device.

9. An electronic circuit as in claim 2 wherein the resonant system includes control circuitry that adjusts the fundamental resonance frequency.

10. An electronic circuit as in claim 9 wherein the control circuitry adjusts the fundamental resonance frequency by changing inductance and/or capacitance values.

11. An electronic circuit as in claim 9 wherein the control circuitry includes at least one variable capacitor whose capacitance is adjustable in response to at least one control signal.

12. An electronic circuit as in claim 9 wherein the control circuitry is arranged in a phase-locked loop.

13. An electronic circuit as in claim 9 wherein the control circuitry includes a plurality of capacitive-gate arrangements coupled to one another in parallel for controllably changing capacitance values in response to at least one control signal, each capacitive-gate arrangement comprising a capacitor and a transmission gate coupled to each other in series.

14. An electronic circuit as in claim 9 wherein the control circuitry includes a phase comparator that compares the phases of the input clock signal and the first circuit clock signal.

15. An electronic circuit as in claim 2 wherein the resonant system includes a driver responsive to the input clock signal for providing a driver signal to a node between the resonator and the capacitor.

16. An electronic circuit as in claim 15 wherein the driver comprises:
   a pre-driver that generates a pair of switching signals substantially in synchronism with the input clock signal, each switching signal having an active level and an inactive level, each switching signal being at its inactive level only when the other switching signal is at its active level, whereby only one of the switching signals is active at any time; and a pair of switches coupled together to a driver line and coupled in series between a pair of different voltage supplies, the switches being respectively responsive to the switching signals for enabling current to flow through the driver line when either switching signal is at its active level.

17. An electronic circuit as in claim 1 wherein the resonator is coupled between the circuit clock line and a source of a reference voltage approximately equal to the time-averaged voltage of the circuit clock signal.

18. An electronic circuit as in claim 17 wherein the resonant system includes a non-parasitic capacitor coupled between (a) the source of the reference voltage and (b) a source of a substantially fixed further reference voltage or other voltage at a much lower frequency than the circuit frequency.

19. An electronic circuit as in claim 18 wherein the resonator comprises a non-parasitic main inductive device comprising an inductor or a group of inductors coupled to one another in series.

20. An electronic circuit as in claim 18 wherein the resonator includes at least one inductive-capacitive arrangement coupled in parallel with at least part of the main inductive device, each inductive-capacitive arrangement comprising an inductor and a capacitor coupled to each other in series.

21. An electronic circuit as in claim 18 wherein the resonator includes at least one capacitor coupled in parallel with part of the main inductive device.

22. An electronic circuit as in claim 17 wherein the resonant system includes control circuitry that adjusts the fundamental resonance frequency.

23. An electronic circuit as in claim 1 wherein the resonant system generates a second circuit clock signal substantially inverse to the first circuit clock signal, at least part of the electronic functions of the function circuitry also being performed in synchronism with the second circuit clock signal.

24. An electronic circuit as in claim 23 wherein the resonator is coupled between the first circuit clock line and a second circuit clock line from which second clock inputs of the function circuitry receive the second circuit clock signal, the resonator also being largely in resonance with capacitance and/or inductance associated with the second circuit clock line and the second clock inputs.

25. An electronic circuit as in claim 24 wherein the resonant system includes at least one switch or capacitor coupled between the clock lines in series with the resonator.

26. An electronic circuit as in claim 24 wherein the oscillations of the resonant system include harmonics of approximately the fundamental resonance frequency.

27. An electronic circuit as in claim 26 wherein the harmonics are odd-numbered harmonics.

28. An electronic circuit as in claim 12 wherein the first circuit clock signal approximates a square wave.

29. An electronic circuit as in claim 23 wherein the resonator comprises a non-parasitic main inductive device comprising an inductor or a group of inductors coupled to one another in series.

30. An electronic circuit as in claim 29 wherein the main inductive device has a controllably variable inductance.

31. An electronic circuit as in claim 29 wherein the resonator includes at least one inductive-capacitive arrangement coupled in parallel with at least part of the main inductive device, each inductive-capacitive arrangement comprising an inductor and a capacitor coupled to each other in series.

32. An electronic circuit as in claim 29 wherein the resonator includes at least one capacitor coupled in parallel with part of the main inductive device.

33. An electronic circuit as in claim 29 wherein the resonator includes at least one capacitor coupled between an internal point of the main inductive device and a source of a substantially fixed reference voltage or other voltage at a much lower frequency than the circuit frequency.

34. An electronic circuit as in claim 29 wherein the resonator includes a distributed capacitor coupled to multiple points of the main inductive device.

35. An electronic circuit as in claim 23 wherein the resonant system includes control circuitry that adjusts the fundamental resonance frequency.

36. An electronic circuit as in claim 35 wherein the control circuitry adjusts the fundamental resonance frequency by changing inductance and/or capacitance values.

37. An electronic circuit as in claim 35 wherein the control circuitry includes at least one variable capacitor whose capacitance is adjustable in response to at least one control signal.

38. An electronic circuit as in claim 35 wherein the control circuitry is arranged in a phase-locked loop.

39. An electronic circuit as in claim 35 wherein the control circuitry includes a plurality of capacitive-gate arrangements coupled to one another in parallel for controllably changing capacitance values in response to at least one control signal, each capacitive-gate arrangement comprising a capacitor and a transmission gate coupled to each other in series.

40. An electronic circuit as in claim 35 wherein the control circuitry includes a phase comparator that compares the phases of the input clock signal and the first circuit clock signal.

41. An electronic circuit as in claim 1 wherein the oscillations of the resonant system locally reach maximum amplitude when they occur at any of the resonance frequencies of the resonant system, including the fundamental resonance frequency.

42. An electronic circuit as in claim 1 wherein the circuit frequency is substantially an integer multiple of the input frequency, whereby the fundamental resonance frequency approximately equals the same integer multiple of the input frequency, the integer multiple including one as the lowest integer multiplier.

43. An electronic circuit as in claim 42 wherein the resonant system controllably adjusts the fundamental resonance frequency towards the integer multiple of the input frequency.

44. An electronic circuit as in claim 1 wherein the resonant system includes a driver via which each circuit clock signal is supplied in response to the input clock signal.

45. An electronic circuit as in claim 44 wherein the driver comprises:

a pre-driver that generates a pair of switching signals substantially in synchronism with the input clock signal, each switching signal having an active level and an inactive level, each switching signal being at its inactive level only when the other switching signal is at its active level, whereby only one of the switching signals is active at any time; and a pair of switches coupled together to a driver line and coupled in series between a pair of different voltage supplies, the switches being respectively responsive to the switching signals for enabling current to flow through the driver line when either switching signal is at its active level.

46. An electronic circuit as in claim 45 wherein the switches comprise a pair of complementary field-effect transistors having respective drains coupled together to the driver line, respective sources respectively coupled to the voltage supplies, and respective gate electrodes that respectively receive the switching signals.

47. An electronic circuit as in claim 1 wherein the oscillations of the resonant system include harmonics of approximately the fundamental resonance frequency.

48. An electronic circuit as in claim 47 wherein the harmonics are odd-numbered harmonics.

49. An electronic circuit as in claim 1 wherein each circuit clock signal has a substantially different voltage swing than the input clock signal.

50. An electronic circuit as in claim 1 wherein each circuit clock signal has a substantially greater voltage swing than the input clock signal.

51. An electronic circuit as in claim 50 wherein the function circuitry includes at least one circuit element comprising:

complementary first and second field-effect transistors ("FETs"), each having a first source/drain electrode, a second source/drain electrode, and a gate electrode coupled to the resonator, a data input signal being supplied to the first source/drain electrode of the first FET;

a first inverter having (a) an input coupled to the second source/drain electrodes and (b) an output for providing a data output signal; and a second inverter having (a) an input coupled to the output of the first inverter and (b) an output coupled to the first source/drain electrode of the second FET.

52. An electronic circuit as in claim 1 wherein the electronic circuit is part of a single integrated circuit.

53. An electronic circuit as in claim 1 wherein the electronic circuit is distributed across at least two integrated circuits mounted on a common substrate.

54. An electronic circuit as in claim 1 wherein the function circuitry comprises CMOS, bipolar, or BiCMOS components.

55. An electronic circuit as in claim 1 wherein the function circuitry includes level-sensitive state elements.

56. An electronic circuit as in claim 1 wherein the first circuit clock signal approximates a square wave.

57. An electronic circuit as in claim 1 wherein the digital function circuitry comprises CMOS circuitry.

58. An electronic circuit comprising:

digital function circuitry which performs electronic functions, specified elements of the function circuitry digitally changing state in synchronism with a first circuit clock signal provided from a first circuit clock line to clock inputs of the specified elements at a circuit frequency; and a resonant system which oscillates at the circuit frequency, the resonant system being operated close to a fundamental resonance frequency such that a resonator in the resonant system is largely in resonance with capacitance and/or inductance associated with the circuit clock line and the clock inputs, the resonant system being coupled to the function circuitry to assist the specified elements in digitally changing state by helping to overcome capacitances and/or inductances associated with the function circuitry, oscillations of the resonant system including frequency components attributable to the fundamental resonance frequency and at least one resonance frequency of the resonant system other than the fundamental resonance frequency.

59. An electronic circuit as in claim 58 wherein the oscillations of the resonant system include harmonics of approximately the fundamental resonance frequency.

60. An electronic circuit as in claim 59 wherein the harmonics are odd-numbered harmonics.

61. An electronic circuit as in claim 58 wherein the resonator comprises a self-driven oscillator.

62. An electronic circuit as in claim 58 wherein each circuit clock line is passively connected between the resonator and the function circuitry.

63. An electronic circuit as in claim 58 wherein the resonator comprises:

a main section that provides oscillations of the resonant system with a frequency component substantially at the fundamental resonance frequency; and a further section that provides oscillations of the resonant system with a frequency component substantially at a harmonic resonance frequency above the fundamental resonance frequency.

64. An electronic circuit as in claim 63 wherein the harmonic resonance frequency is an odd-numbered harmonic.

65. An electronic circuit as in claim 58 wherein energy is transferred in a resonant manner among the resonator, a temporary storage site, and capacitance and/or inductance associated with the first circuit clock line and the clock inputs that receive the first circuit clock signal.

66. An electronic circuit as in claim 58 wherein the first circuit clock signal approximates a square wave.

67. An electronic circuit as in claim 58 wherein the digital function circuitry comprises CMOS circuitry.

68. An electronic circuit comprising:

a resonant system which, in response to an input clock signal at an input clock frequency, oscillates at a circuit frequency substantially proportional to the input clock frequency to generate a first circuit clock signal at the circuit frequency; and function circuitry which performs electronic functions in synchronism with the circuit clock signal, clock inputs of the function circuitry receiving the circuit clock signal from a first circuit clock line, the resonant system being operated close to a fundamental resonance frequency such that a resonator in the resonant system is largely in resonance at least with capacitance and/or inductance associated with the circuit clock line and the clock inputs, the resonant system including:

a non-parasitic capacitor coupled between the resonator and a source of a substantially fixed reference voltage or other voltage at a much lower frequency than the circuit frequency, the resonator being coupled to the circuit clock line; and a driver responsive to the input clock signal for providing a driver signal to a node between the resonator and the capacitor.

69. An electronic circuit as in claim 68 wherein the driver comprises:

a pre-driver that generates a pair of switching signals substantially in synchronism with the input clock signal, each switching signal having an active level and an inactive level, each switching signal being at its inactive level only when the other switching signal is at its active level, whereby only one of the switching signals is active at any time; and a pair of switches coupled together to a driver line and coupled in series between a pair of different voltage supplies, the switches being respectively responsive to the switching signals for enabling current to flow through the driver line when either switching signal is at its active level.

70. An electronic circuit comprising:

a resonant system which, in response to an input clock signal at an input clock frequency, oscillates at a circuit frequency substantially proportionally to the input clock frequency to generate a first circuit clock signal at the circuit frequency, the circuit clock signal having a substantially greater voltage swing than the input clock signal; and function circuitry which performs electronic functions in synchronism with the circuit clock signal, clock inputs of the function circuitry receiving the circuit clock signal from a first circuit clock line, the resonant system being operated close to a fundamental resonance frequency such that a resonator in the resonant system is largely in resonance at least with capacitance and/or inductance associated with the circuit clock line and the clock inputs.

71. An electronic circuit as in claim 70 wherein the function circuitry includes at least one circuit element comprising:

complementary first and second field-effect transistors ("FETs"), each having a first source/drain electrode, a second source/drain electrode, and a gate electrode coupled to the resonator, a data input signal being supplied to the first source/drain electrode of the first FET;

a first inverter having (a) an input coupled to the second source/drain electrodes and (b) an output for providing a data output signal; and a second inverter having (a) an input coupled to the output of the first inverter and (b) an output coupled to the first source/drain electrode of the second FET.

72. An electronic circuit comprising:

a resonant system which, in response to an input clock signal at an input clock frequency, oscillates at a circuit frequency substantially proportional to the input clock frequency to generate a first circuit clock signal at the circuit frequency; and function circuitry which performs electronic functions in synchronism with the circuit clock signal, clock inputs of the function circuitry receiving the circuit clock signal from a first circuit clock line, the resonant system being operated close to a fundamental resonance frequency such that a resonator in the resonant system is largely in resonance at least with capacitance and/or inductance associated with the circuit clock line and the clock inputs, oscillations of the resonant system including frequency components attributable to the fundamental resonance frequency and at least one resonance frequency of the resonant system other than the fundamental resonance frequency such that the first circuit clock signal approximates a square wave.

73. An electronic circuit as in claim 72 wherein oscillations of the resonant system include odd-numbered harmonics of approximately the fundamental resonance frequency.

74. An electronic circuit as in claim 72 wherein the resonant system includes a non-parasitic capacitor coupled between the resonator and a source of a substantially fixed reference voltage or other voltage at a much lower frequency than the circuit frequency, the resonator being coupled to the circuit clock line.

75. An electronic circuit as in claim 72 wherein the resonator is coupled between the circuit clock line and a source of a reference voltage approximately equal to the time-averaged voltage of the circuit clock signal.

76. An electronic circuit as in claim 75 wherein the resonant system includes a non-parasitic capacitor coupled between (a) the source of the reference voltage and (b) a source of a substantially fixed further reference voltage or other voltage at a much lower frequency than the circuit frequency.

77. An electronic circuit as in claim 72 wherein the resonant system generates a second circuit clock signal substantially inverse to the first circuit clock signal such that the second circuit clock signal also approximates a square wave, at least part of the electronic functions of the function circuitry also being performed in synchronism with the second circuit clock signal.

78. An electronic circuit as in claim 77 wherein the resonator is coupled between the first circuit clock line and a second circuit clock line from which second clock inputs of the function circuitry receive the second circuit clock signal, the resonator also being largely in resonance with capacitance and/or inductance associated with the second circuit clock line and the second clock inputs.

79. An electronic circuit comprising:

function circuitry which performs electronic functions, specified elements of the function circuitry changing state in synchronism with a first circuit clock signal provided from a first circuit clock line to clock inputs of the specified elements at a circuit frequency; and a resonant system which oscillates at the circuit frequency, the resonant system being operated close to a fundamental resonance frequency such that a resonator in the resonant system is largely in resonance with capacitance and/or inductance associated with the circuit clock line and the clock inputs, the resonant system being coupled to the function circuitry to assist the specified elements in changing state by helping to overcome capacitances and/or inductances associated with the function circuitry, oscillations of the resonant system including frequency components attributable to the fundamental resonance frequency and at least one resonance frequency of the resonant system other than the fundamental resonance frequency such that the first circuit clock signal approximates a square wave.

80. An electronic circuit as in claim 79 wherein oscillations of the resonant system include odd-numbered harmonics of approximately the fundamental resonance frequency.

81. An electronic circuit as in claim 79 wherein the resonator comprises a self-driven oscillator.

82. An electronic circuit comprising:

a resonant system which, in response to an input clock signal at an input clock frequency, oscillates at a circuit frequency substantially proportional to the input clock frequency to generate (a) a first circuit clock signal at the circuit frequency and (b) a second circuit clock signal substantially inverse to the first circuit clock signal; and function circuitry which performs electronic functions in synchronism with the circuit clock signal, first clock inputs of the function circuitry receiving the first circuit clock signal from a first circuit clock line, second clock inputs of the function circuitry receiving the second clock signal from a second circuit clock line, the resonant system being operated close to a fundamental resonance frequency such that a resonator in the resonant system is largely in resonance at least with capacitance and/or inductance associated with the circuit clock lines and the clock inputs, the resonator being coupled between the circuit clock lines such that current flowing out of the resonator to each circuit clock line at any time substantially equals current flowing into the resonator from the other circuit clock line, oscillations of the resonant system including frequency components attributable to the fundamental resonance frequency and at least one resonance frequency of the resonant system other than the fundamental resonance frequency.

83. An electronic circuit as in claim 82 wherein the resonator comprises:

a non-parasitic main inductive device coupled between the circuit clock lines; and at least one capacitor coupled in parallel with part of the main inductive device.

84. An electronic circuit comprising:

function circuitry which performs electronic functions, specified elements of the function circuitry changing state in synchronism (a) with a first circuit clock signal provided from a first circuit clock line to first clock inputs of the specified elements at a circuit frequency and (b) with a second circuit clock signal provided from a second circuit clock line to second clock inputs of the specified elements, the second circuit clock signal being substantially inverse to the first circuit clock signal; and a resonant system which oscillates at the circuit frequency, the resonant system being operated close to a fundamental resonance frequency such that a resonator in the resonant system is largely in resonance with capacitance and/or inductance associated with the circuit clock lines and the clock inputs, the resonator being coupled between the circuit clock lines such that current flowing out of the resonator to each circuit clock line at any time substantially equals current flowing into the resonator from the other circuit clock line, the resonant system thereby being coupled to the function circuitry to assist the specified elements in changing state by helping to overcome capacitances and/or inductances associated with the function circuitry, oscillations of the resonant system including frequency components attributable to the fundamental resonance frequency and at least one resonance frequency of the resonant system other than the fundamental resonance frequency.

85. An electronic circuit as in claim 84 wherein the resonator comprises a self-driven oscillator.

* * * * *